(12) United States Patent
Nozawa et al.

(10) Patent No.: US 11,694,891 B2
(45) Date of Patent: Jul. 4, 2023

(54) FILM FORMING APPARATUS AND FILM FORMING METHOD

(71) Applicant: Tokyo Electron Limited, Tokyo (JP)

(72) Inventors: Syuji Nozawa, Nirasaki (JP); Tatsuya Yamaguchi, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 260 days.

(21) Appl. No.: 16/940,689

(22) Filed: Jul. 28, 2020

(65) Prior Publication Data

US 2021/0043447 A1 Feb. 11, 2021

(30) Foreign Application Priority Data

Aug. 5, 2019 (JP) .................. 2019-143853

(51) Int. Cl.
*H01L 21/02* (2006.01)
*B05D 1/00* (2006.01)
*H01L 21/67* (2006.01)

(52) U.S. Cl.
CPC .......... *H01L 21/02271* (2013.01); *B05D 1/60* (2013.01); *H01L 21/02118* (2013.01); *H01L 21/67103* (2013.01); *H01L 21/67115* (2013.01); *H01L 21/67248* (2013.01)

(58) Field of Classification Search
None
See application file for complete search history.

(56) References Cited

U.S. PATENT DOCUMENTS

| 2005/0229848 A1* | 10/2005 | Shinriki | ............ | C23C 16/45529 |
| | | | | 427/255.28 |
| 2015/0267294 A1* | 9/2015 | Itatani | ................. | C23C 16/4412 |
| | | | | 438/758 |

FOREIGN PATENT DOCUMENTS

| KR | 10-2012-0135253 A | 12/2012 |
| WO | 2008129925 A1 | 10/2008 |

OTHER PUBLICATIONS

EP 3561861, Substrate processing apparatus and program for substrate processing apparatus, Hayashi et al, Oct. 30, 2019 (Year: 2019).*
JP WO2008129925, Polyurea Film and Method for forming the same, Daiseuke et al., Jul. 22, 2010 (Year: 2010).*

* cited by examiner

*Primary Examiner* — Alexander G Ghyka
(74) *Attorney, Agent, or Firm* — Nath, Goldberg & Meyer; Jerald L. Meyer; Tanya E. Harkins

(57) ABSTRACT

A film forming apparatus comprises: a processing chamber in which a substrate is accommodated; a gas supply configured to supply a gas containing a first monomer and a gas containing a second monomer into the processing chamber; a concentration distribution controller configured to control a gas flow within the processing chamber such that a concentration of a mixed gas including the gas containing the first monomer and the gas containing the second monomer on the substrate has a predetermined distribution; and a temperature distribution controller configured to control a temperature distribution of the substrate such that a temperature of a first region of the substrate is higher than a temperature of a second region of the substrate, the concentration of the mixed gas in a region corresponding to the first region being higher than the concentration of the mixed gas in a region corresponding to the second region.

7 Claims, 18 Drawing Sheets

FILM FORMING APPARATUS AND FILM
FORMING METHOD

CROSS-REFERENCE TO RELATED
APPLICATION

This application is based upon and claims the benefit of priority from Japanese Patent Application No. 2019-143853, filed on Aug. 5, 2019, the entire contents of which are incorporated herein by reference.

TECHNICAL FIELD

Various aspects and embodiments of the present disclosure relate to a film forming apparatus and a film formation control method.

BACKGROUND

A technique for forming a polymeric organic film on a substrate through a polymerization reaction of two types of monomers by supplying gas including two types of monomers into a processing chamber in which the substrate is accommodated is known. For example, there is a technique for forming a polymer film on a substrate by vacuum deposition polymerization reaction of an aromatic alkyl, alicyclic or aliphatic diisocyanate monomer and an aromatic alkyl, alicyclic or aliphatic diamine monomer (see, for example, Patent Document 1).

PRIOR ART DOCUMENT

Patent Document

Patent Document 1: International Publication No. WO2008/129925

SUMMARY

According to one embodiment of the present disclosure, there is provided a film forming apparatus for forming an organic film of a polymer on a substrate by deposition polymerization, the film forming apparatus comprising a processing chamber in which the substrate is accommodated; a gas supply configured to supply a gas containing a first monomer and a gas containing a second monomer into the processing chamber; a concentration distribution controller configured to control a gas flow within the processing chamber such that a concentration of a mixed gas including the gas containing the first monomer and the gas containing the second monomer on the substrate has a predetermined distribution; and a temperature distribution controller configured to control a temperature distribution of the substrate such that a temperature of a first region of the substrate is higher than a temperature of a second region of the substrate, the concentration of the mixed gas in a region corresponding to the first region being higher than the concentration of the mixed gas in a region corresponding to the second region.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Hereinafter, embodiments of a film forming apparatus and a film forming method disclosed herein will be described in detail with reference to the drawings. The disclosed film forming apparatus and film forming method are not limited by the following embodiments. It is possible to appropriately combine respective embodiments as long as the contents thereof do not contradict each other.

In vapor deposition polymerization, a film forming rate greatly varies depending on a temperature of a substrate. Therefore, it is considered that the temperature of the substrate is made more uniform to make a film thickness of a polymer film to be formed uniform.

However, the film forming rate of an organic film formed on a substrate also varies depending on the concentrations of gas including two types of monomers. Therefore, even if the temperature of the substrate is uniform, it is difficult to make the film thickness uniform if the concentration of the gas including two types of monomers supplied onto the substrate varies depending on a region on the substrate.

Therefore, the present disclosure provides a technique capable of enhancing the uniformity of the film thickness of an organic film formed on a substrate.

First Embodiment

[Configuration of Film Forming Apparatus 1]

Figure 1:
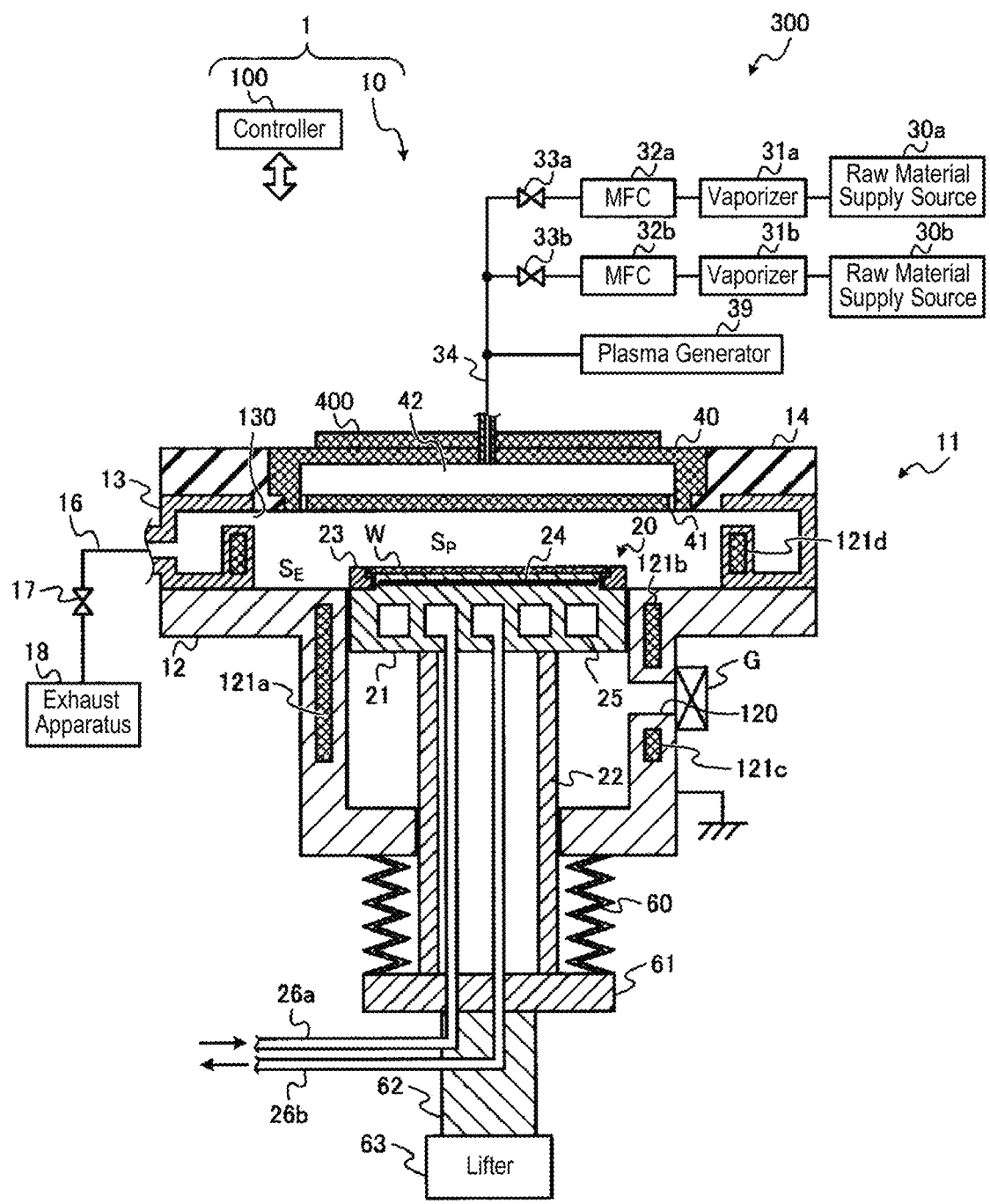
FIG. 1 is a view illustrating an example of a film forming apparatus according to a first embodiment of the present disclosure.

FIG. 1 is a view illustrating an example of a film forming apparatus 1 according to a first embodiment of the present disclosure. The film forming apparatus 1 according to the present embodiment forms an organic film of a polymer on a substantially disk-shaped wafer W, which is an example of a substrate, by vapor deposition polymerization using multiple types of monomers. The film forming apparatus 1 includes an apparatus body 10 and a controller 100. The apparatus body 10 includes a processing chamber 11 that accommodates a wafer W.

The processing chamber 11 has a lower chamber 12 and an exhaust duct 13 formed of a metal such as aluminum. The lower chamber 12 constitutes the lower portion of the processing chamber 11. The lower chamber 12 is grounded. Side wall heaters 121a to 121c are embedded in the side wall of the lower chamber 12. In addition, an opening 120 for loading and unloading a wafer W is formed in the side wall of the lower chamber 12. The opening 120 is opened and closed by a gate valve G.

The exhaust duct 13 is provided above the lower chamber 12 and forms a part of the side wall of the processing chamber 11. In the present embodiment, the exhaust duct 13 has a hollow rectangular shape in vertical cross section, and is curved in an annular shape along the upper portion of the lower chamber 12. In the exhaust duct 13, a slit-shaped exhaust port 130 is formed along the extension direction of the exhaust duct 13. The exhaust port 130 is arranged outside a region of the wafer W along the peripheral edge of the wafer W accommodated in the processing chamber 11, and exhausts the gas in the processing chamber 11. A side wall heater 121d is embedded in the side wall of the exhaust duct 13 facing the space inside the processing chamber 11. The wafer W placed on the stage 21 is heated by radiant heat from the side wall heaters 121a to 121d. A temperature of the side wall heaters 121a to 121d is controlled by a controller 100, for example, in units of 1° C.

In addition, one end of an exhaust pipe 16 is connected to the exhaust duct 13. The other end of the exhaust pipe 16 is connected to an exhaust apparatus 18 having, for example, a vacuum pump, via a pressure adjustment valve 17 such as an auto pressure controller (APC) valve. The pressure adjustment valve 17 is controlled by the controller 100, and controls the pressure inside the processing chamber 11 to a preset pressure. The exhaust pipe 16, the pressure adjustment valve 17, and the exhaust apparatus 18 are heated to a temperature of, for example, about 150° C. by a heater (not illustrated) to suppress the adhesion of reaction byproducts (so-called deposits).

A support structure 20 on which a wafer W is placed is provided in the processing chamber 11. The support structure 20 has a stage 21 and a support 22. The stage 21 is made of a metal such as aluminum, and a wafer W is placed on the top surface thereof. The support 22 is made of, for example, a metal such as aluminum, in a tubular shape, and supports the stage 21 from below.

A stage heater 24 is embedded in the stage 21. The stage heater 24 heats the wafer W placed on the stage 21 according to the supplied electric power. The power supplied to the stage heater 24 is controlled by the controller 100, and a temperature of the stage heater 24 is controlled, for example, in units of 1° C.

A flow path 25 through which a heat medium flows is formed in the stage 21. A temperature adjuster such as a chiller unit (not illustrated) is connected to the flow path 25 via a pipe 26a and a pipe 26b. The heat medium adjusted to a predetermined temperature by the temperature adjuster is supplied to the flow path 25 via the pipe 26a, and the heat medium flowing in the flow path 25 is returned to the temperature adjuster via the pipe 26b. A temperature of the stage 21 is controlled by the heat medium circulating in the flow path 25. The temperature adjuster is controlled by the controller 100. A temperature of the heat medium is controlled by the controller 100, for example, in units of 1° C.

At the top surface of the stage 21, an annular edge ring 23 is detachably arranged around the wafer W mounted on the stage 21.

The support 22 is arranged within the lower chamber 12 to penetrate an opening formed in the bottom portion of the lower chamber 12. A flange 61 made of a conductive material is connected to the lower end of the support 22. The upper end of the shaft 62 is connected to the bottom surface side of the flange 61. The lower end of the shaft 62 is connected to a lifter 63. The lifter 63 moves the shaft 62 up and down. When the shaft 62 is moved up and down by the lifter 63, the support structure 20 is moved up and down integrally with the flange 61. The lifter 63 controls the distance between the wafer W placed on the stage 21 and a ceiling plate 40 to be described later.

The bottom portion of the lower chamber 12 and the flange 61 are connected via a metal bellows 60. As a result, the airtightness inside the processing chamber 11 is maintained even when the support structure 20 is moved up and down by the lifter 63. The bellows 60 and the flange 61 are grounded via the processing chamber 11. The stage 21 is connected to the flange 61 via the support 22, and is grounded via the flange 61.

A ceiling plate 40 is provided above the annular exhaust duct 13. The ceiling plate 40 is supported by an insulator 14 arranged on the exhaust duct 13. The insulator 14 and the ceiling plate 40 form the ceiling portion of the processing chamber 11. In the processing chamber 11, the space between the wafer W placed on the stage 21 and the ceiling plate 40 is defined as a processing space $S_P$, and the space outside the processing space $S_P$ is defined as an external space $S_E$.

A diffusion chamber 42 for diffusing gas is formed in the ceiling plate 40. A pipe 34 for supplying gas into the diffusion chamber 42 is connected to the top surface of the ceiling plate 40. In addition, a plurality of ejection ports 41 communicating with the diffusion chamber 42 are formed in the bottom surface of the ceiling plate 40. The gas supplied from the pipe 34 into the diffusion chamber 42 diffuses inside the diffusion chamber 42, and is supplied from the ejection ports 41 to the space inside the processing chamber 11.

Figure 2:
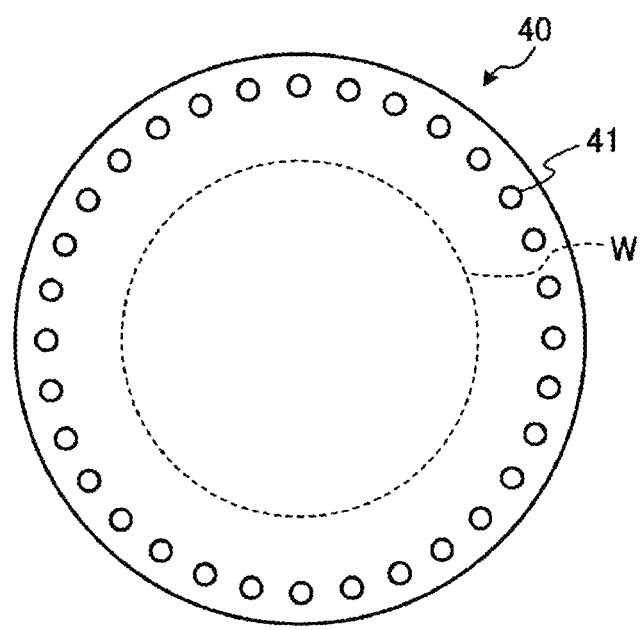
FIG. 2 is a diagram illustrating an example of a surface of a ceiling plate at a processing space side.

FIG. 2 is a view illustrating an example of the surface of the ceiling plate 40 on the processing space $S_P$ side. In FIG. 2, the appearance of a wafer W placed on the stage 21 is indicated by the broken line. In the present embodiment, the ejection ports 41 are arranged along the peripheral edge of the wafer W placed on the stage 21, as illustrated in FIG. 2, and supply the gas supplied into the diffusion chamber 42 to the external space $S_E$, which is a space outside the region of the wafer W in the processing chamber 11. The ejection ports 41 are exemplary first supply ports. The ejection ports 41 may be arranged directly above the edge ring 23, as long as the ejection ports are configured to eject gas into the external space $S_E$ outside the region of the wafer W.

Returning back to FIG. 1, the description will be continued. A ceiling plate heater 400 is provided on the top surface of the ceiling plate 40. The ceiling plate heater 400 heats the ceiling plate 40, and the radiant heat from the ceiling plate 40 heats the wafer W placed on the stage 21. A temperature of the ceiling plate heater 400 is controlled by the controller 100, for example, in units of 1° C.

A gas supply 300 is connected to the pipe 34. The gas supply 300 has raw material supply sources 30a and 30b, vaporizers 31a and 31b, mass flow controllers (MFCs) 32a and 32b, and valves 33a and 33b. A raw material supply source 30a is connected to the valve 33a via the MFC 32a and the vaporizer 31a. The raw material supply source 30b is connected to the valve 33b via the MFC 32b and the vaporizer 31b.

The raw material supply source 30a is a supply source containing a first monomer such as isocyanate. The vaporizer 31a vaporizes the liquid containing the first monomer supplied from the raw material supply source 30a. The MFC 32a controls the flow rate of the gas containing the first monomer vaporized by the vaporizer 31a. The valve 33a controls supply and stopping of supply of the gas containing the first monomer to the pipe 34.

The raw material supply source 30b is a supply source containing a second monomer such as an amine. The vaporizer 31b vaporizes the liquid containing the second monomer supplied from the raw material supply source 30b. The MFC 32b controls the flow rate of the gas containing the second monomer vaporized by the vaporizer 31b. The valve 33b controls supply and stopping of supply of the gas containing the second monomer to the pipe 34.

The gas containing the first monomer supplied from the raw material supply source 30a and the gas containing the second monomer supplied from the raw material supply source 30b are supplied into the diffusion chamber 42 through the pipe 34 to be mixed while being diffused inside the diffusion chamber 42. Then, the mixed gas containing the first monomer and the second monomer is supplied into the processing chamber 11 through the ejection ports 41, and forms an organic film of a polymer having a polyurea bond on the wafer W placed on the stage 21.

The plurality of ejection ports 41 in the ceiling plate 40 discharge the mixed gas of two types of monomers into the external space $S_E$ outside the region of the wafer W placed on the stage 21. The mixed gas ejected from the ejection ports 41 diffuses from the external space $S_E$ into the processing space $S_P$ on the wafer W.

Here, when the gap between the ceiling plate 40 and the wafer W on the stage 21 is large, the conductance of the processing space $S_P$ becomes larger than the conductance of the external space $S_E$, and thus it is easy for the mixed gas supplied into the external space $S_E$ to diffuse into the processing space $S_P$. As a result, the concentration of the mixed gas in the region near the center of the wafer W becomes higher than the concentration of the mixed gas in the region near the edge of the wafer W.

Meanwhile, when the gap between the ceiling plate 40 and the wafer W on the stage 21 becomes smaller, the conductance of the processing space $S_P$ becomes smaller than the conductance of the external space $S_E$, and thus it is difficult for the mixed gas supplied into the external space $S_E$ to diffuse into the processing space $S_P$. As a result, the concentration of the mixed gas in the region near the center of the wafer W becomes lower than the concentration of the mixed gas in the region near the edge of the wafer W.

As described above, in the film forming apparatus 1 of the present embodiment, a mixed gas of two types of monomers is ejected into the external space $S_E$ outside the region of the wafer W placed on the stage 21, and the gap between the ceiling plate 40 and the wafer W on the stage 21 is adjusted. This makes it possible to control the concentration distribution of the mixed gas in the radial direction of the wafer W around the central axis of the wafer W. The plurality of ejection ports 41 and the lifter 63 form an example of a concentration distribution controller.

The pipe 34 is heated to a temperature of about 200° C. by a heater (not illustrated), and the ceiling plate 40 is heated to a temperature of about 180° C. by the ceiling plate heater 400. As a result, the polymerization reaction between the first monomer and the second monomer is suppressed in the pipe 34 and the diffusion chamber 42. Meanwhile, the surface of the wafer W is controlled to, for example, about 85° C. As a result, an organic film of a polymer is formed on the surface of the wafer W by the mixed gas containing the first monomer and the second monomer.

A plasma generator 39 that generates plasma is connected to the pipe 34. The plasma generator 39 turns cleaning gas into plasma, and supplies active species included in the plasma into the diffusion chamber 42 in the ceiling plate 40 via the pipe 34. For example, the active species supplied into the diffusion chamber 42 are supplied into the processing chamber 11 via the ejection ports 41. As the cleaning gas, for example, oxygen ($O_2$) gas or halogen-containing gas may be used. As the halogen-containing gas, for example, chlorine ($Cl_2$) gas, hydrogen chloride (HCl) gas, bromine ($Br_2$) gas, hydrogen bromide (HBr) gas, or hydrogen iodide (HI) may be used.

After forming an organic film by vapor deposition polymerization on several wafers W, the cleaning gas is turned into plasma by the plasma generator 39, and the active species included in the plasma are supplied into the processing chamber 11. Then, the deposits attached to the processing chamber 11 are removed by, for example, the active species supplied into the processing chamber 11.

The controller 100 has memory, a processor, and an input/output interface. The processor in the controller 100 controls each part of the apparatus body 10 via the input/output interface by reading and executing a program or recipe stored in the memory.

[Temperature Dependence of Deposition Rate]

Figure 3:
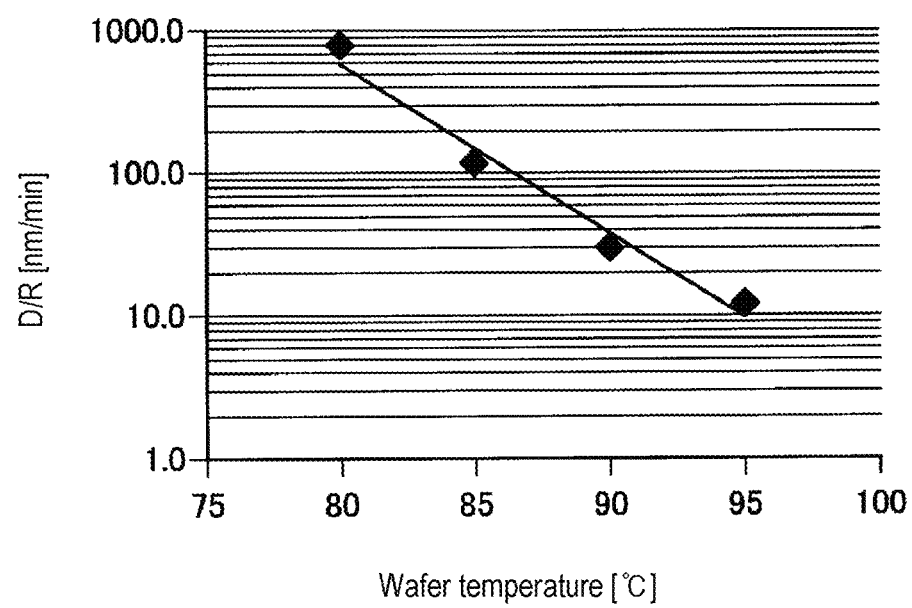
FIG. 3 is a diagram showing an example of a relationship between a temperature of a wafer and a deposition rate (D/R).

Here, the mixed gas containing the first monomer and the second monomer is more likely to cause a polymerization reaction at a lower temperature. Therefore, as illustrated in FIG. 3, for example, the lower the temperature of the wafer W, the higher the deposition rate (D/R) of an organic film of a polymer laminated on a wafer W. FIG. 3 is a diagram showing an example of a relationship between the temperature of a wafer W and D/R.

In the example of FIG. 3, the D/R of the polymer changes by about 5% per 1° C. Therefore, when the temperature of the wafer W is controlled using only the stage heater 24 and the heat medium, which are controlled with, for example, a resolution of 1° C. unit, the film thickness of the wafer W varies in the range of about 5%. When the film thickness of the wafer W varies greatly, it is difficult to meet a required film thickness specification.

In order to reduce the variation in the film thickness on the wafer W, it is conceivable to control the temperature of the stage heater 24 and the heat medium with a resolution finer than 1° C. unit. However, in that case, since the film forming apparatus 1 becomes large and the costs of the film forming apparatus 1 increase, it is difficult to improve the resolution of the temperature control of the stage heater 24 and the heat medium.

[Temperature Distribution of Wafer W]

Figure 4:
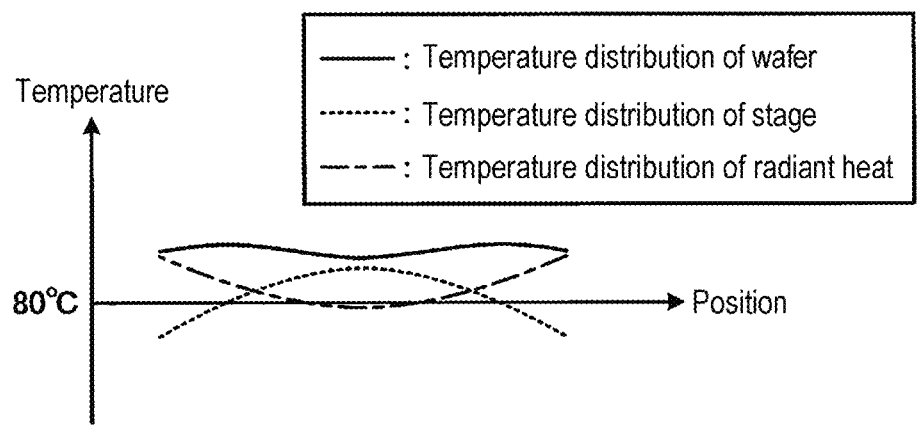
FIG. 4 is a diagram showing an example of a temperature distribution of a wafer.

FIG. 4 is a diagram showing an example of a temperature distribution of a wafer W. When the temperature of the stage heater 24 is set to, for example, 80° C., the temperature distribution on the top surface of the stage 21 by the stage heater 24 becomes, for example, the temperature distribution indicated by the dotted line in FIG. 4.

Meanwhile, the temperature distribution of radiant heat from the ceiling plate heater 400 and the side wall heaters 121a to 121d is, for example, the temperature distribution indicated by the one-dot chain line in FIG. 4. In this case, the temperature of the ceiling plate heater 400 and the side wall heaters 121a to 121d is, for example, 120° C., and the gap between the ceiling plate heater 400 and the wafer W on the stage 21 is, for example, 20 mm.

The temperature distribution of the wafer W becomes the temperature distribution in which the temperature distribution of the stage heater 24 and the temperature distribution of the radiant heat from the ceiling plate heater 400 and the side wall heaters 121a to 121d are combined, as indicated by the solid line in FIG. 4. Therefore, even when the temperature of the stage heater 24 and the gap between the ceiling plate heater 400 and the wafer W on the stage 21 are fixed, it is possible to change the temperature of the wafer W by adjusting the radiant heat from the ceiling plate heater 400 and the side wall heaters 121a to 121d.

[Relationship Between Temperature of Ceiling Plate Heater 400 and Temperature of Wafer W]

Figure 5:
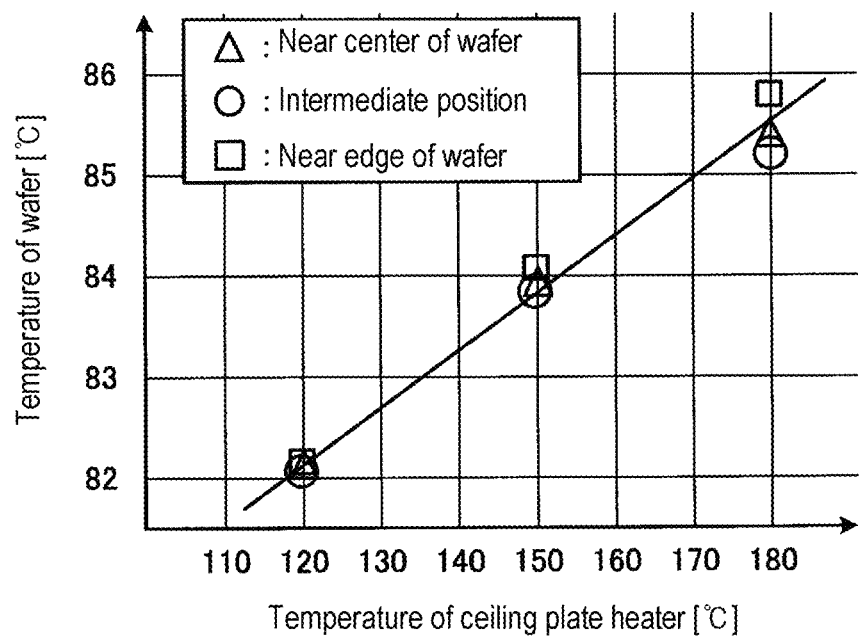
FIG. 5 is a diagram showing an example of a relationship between a temperature of a ceiling plate heater and a temperature of a wafer.

FIG. 5 is a diagram showing an example of a relationship between the temperature of a ceiling plate heater 400 and the temperature of a wafer W. In the test illustrated in FIG. 5, the temperature of the stage 21 is set to 80° C. by the stage heater 24, the temperature of the side wall heaters 121a to 121d is set to 120° C., and the gap between the ceiling plate heater 400 and the wafer W on the stage 21 is set to 20 mm.

For example, as shown in FIG. 5, when the temperature of the ceiling plate heater 400 rises, the temperature of the wafer W also rises due to the radiant heat from the ceiling plate 40 heated by the ceiling plate heater 400. Referring to FIG. 5, this tendency is the same at any position near the center of the wafer W, near the edge, and the intermediate position therebetween.

Here, even if the temperature of the ceiling plate heater 400 rises by 60° C., the temperature of the wafer W rises only by about 6° C. That is, the temperature change of the wafer W is about 1/10 of the temperature change of the ceiling plate heater 400. Therefore, if the temperature of the ceiling plate heater 400 is controlled with a resolution of 1° C., it is possible to control the temperature of the wafer W with a resolution of 1 degree or less (specifically, for example, a resolution of about 0.1° C.). Thereby, it is possible to reduce the variation in the film thickness of the wafer W to a range of, for example, about 1.5%.

Even in the side wall heaters 121a to 121d, radiant heat is radiated to the wafer W from the side walls of the lower chamber 12 and the exhaust duct 13. Therefore, by controlling the temperature of the side wall heaters 121a to 121d in units of 1° C., it is possible to control the temperature of the wafer W with a resolution of 1° C. or less. By adjusting the temperature ratio between the ceiling plate heater 400 and the side wall heaters 121a to 121d, it is possible to adjust the temperature near the center of the wafer W to be higher than that that near the edge of the wafer W, or to adjust the temperature near the center of the wafer W to be lower than that near the edge of the wafer W. Therefore, by adjusting the temperature ratio between the ceiling plate heater 400 and the side wall heaters 121a to 121d, it is possible to control the temperature distribution of the wafer W in the radial direction with respect to the central axis of the wafer W. The ceiling plate heater 400 and the side wall heaters 121a to 121d forms an example of a temperature distribution controller.

[Relationship Between Gap Between Ceiling Plate 40 and Wafer W on Stage 21 and Temperature of Wafer W]

When, for example, a silicon film, a dielectric film, or a metal film is formed through, for example, chemical vapor deposition (CVD) or atomic layer deposition (ALD), the film formation is controlled by a surface adsorption reaction. Therefore, in the film formation such as CVD or ALD, the temperature of the stage heater 24 of the stage 21 on which a wafer W is placed becomes dominant. However, in the polymerization reaction using two types of monomers as in the present embodiment, not only the temperature of the stage heater 24 but also the temperature of the processing space $S_P$ affects the reaction.

Figure 6:
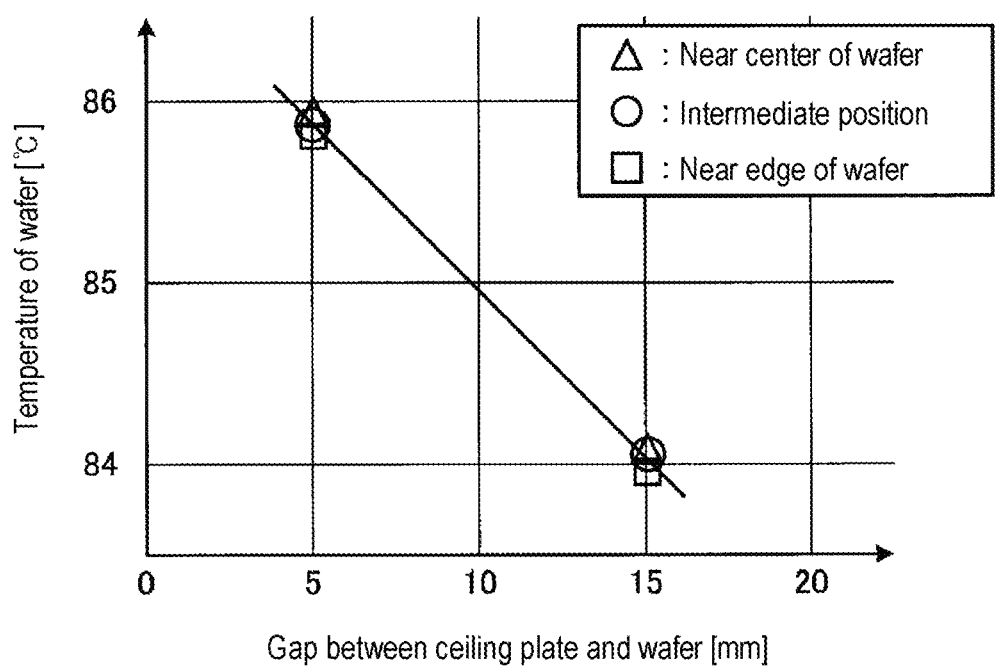
FIG. 6 is a diagram showing an example of a relationship between a gap between a ceiling plate and a wafer on a stage and a temperature of the wafer.

FIG. 6 is a diagram showing an example of a relationship between the temperature of a wafer W and the gap between the ceiling plate 40 and the wafer W on the stage 21. In the test shown in FIG. 6, the temperature of the stage 21 was set to 80° C. by the stage heater 24, and the temperatures of the ceiling plate heater 400 and the side wall heaters 121a to 121d are set to 120° C., respectively.

For example, as shown in FIG. 6, when the gap between the ceiling plate 40 and the wafer W on the stage 21 increases, the amount of radiant heat applied to the wafer W from the ceiling plate 40 decreases, and thus the temperature of the wafer W falls. Meanwhile, when the gap between the ceiling plate 40 and the wafer W on the stage 21 becomes smaller, the amount of radiant heat applied to the wafer W from the ceiling plate 40 increases, and thus the temperature of the wafer W rises.

Here, referring to FIG. 6, when the gap between the ceiling plate 40 and the wafer W on the stage 21 increased by 10 mm, the temperature of the wafer W decreased by about 2° C. That is, it is possible to change the temperature of the wafer W by about 0.2° C. by changing the gap between the ceiling plate 40 and the wafer W on the stage 21 by 1 mm. In the lifter 63 of the present embodiment, it is possible to raise or lower the stage 21 with a resolution of a 0.5 mm unit. Therefore, by controlling the gap between the ceiling plate 40 and the wafer W on the stage 21, it is possible to adjust the temperature of the wafer W in units of about 0.1° C. By controlling the gap between the ceiling plate 40 and the wafer W on the stage 21, it is possible to reduce the variation in the film thickness on the wafer W to a range of, for example, about 1.5%.

Here, when the gap between the ceiling plate 40 and the wafer W on the stage 21 increases, the influence of the radiant heat from the ceiling plate 40 becomes smaller, compared to the heat from the stage heater 24 and the radiant heat from the side wall heaters 121a to 121d is reduced. As a result, in the wafer W on the stage 21, the temperature near the center of the wafer W becomes lower than the temperature near the edge of the wafer W. Meanwhile, when the gap between the ceiling plate 40 and the wafer W on the stage 21 decreases, the influence of the radiant heat from the ceiling plate 40 becomes larger, compared to the radiant heat from the stage heater 24 and the radiant heat from the side wall heaters 121a to 121d. As a result, in the wafer W on the stage 21, the temperature near the center of the wafer W becomes higher than the temperature near the edge of the wafer W.

As described above, in the film forming apparatus 1 of the present embodiment, it is also possible to control the temperature distribution of the wafer W in the radial direction of the wafer W about the central axis of the wafer W as the center by adjusting the gap between the ceiling plate 40 and the wafer W on the stage 21.

[Film Thickness Distribution]

Here, a simulation was performed on the distribution of a film thickness of an organic film formed on a wafer W by vapor deposition polymerization. In the simulation, a film forming apparatus in which two types of monomers are also supplied using a shower head having a large number of ejection ports provided in the region of the wafer W was used as a comparative example. In the film forming apparatus of the comparative example using the shower head, the mixed gas of the two types of monomers is substantially uniformly supplied to the entire region of the wafer W.

Figure 7:
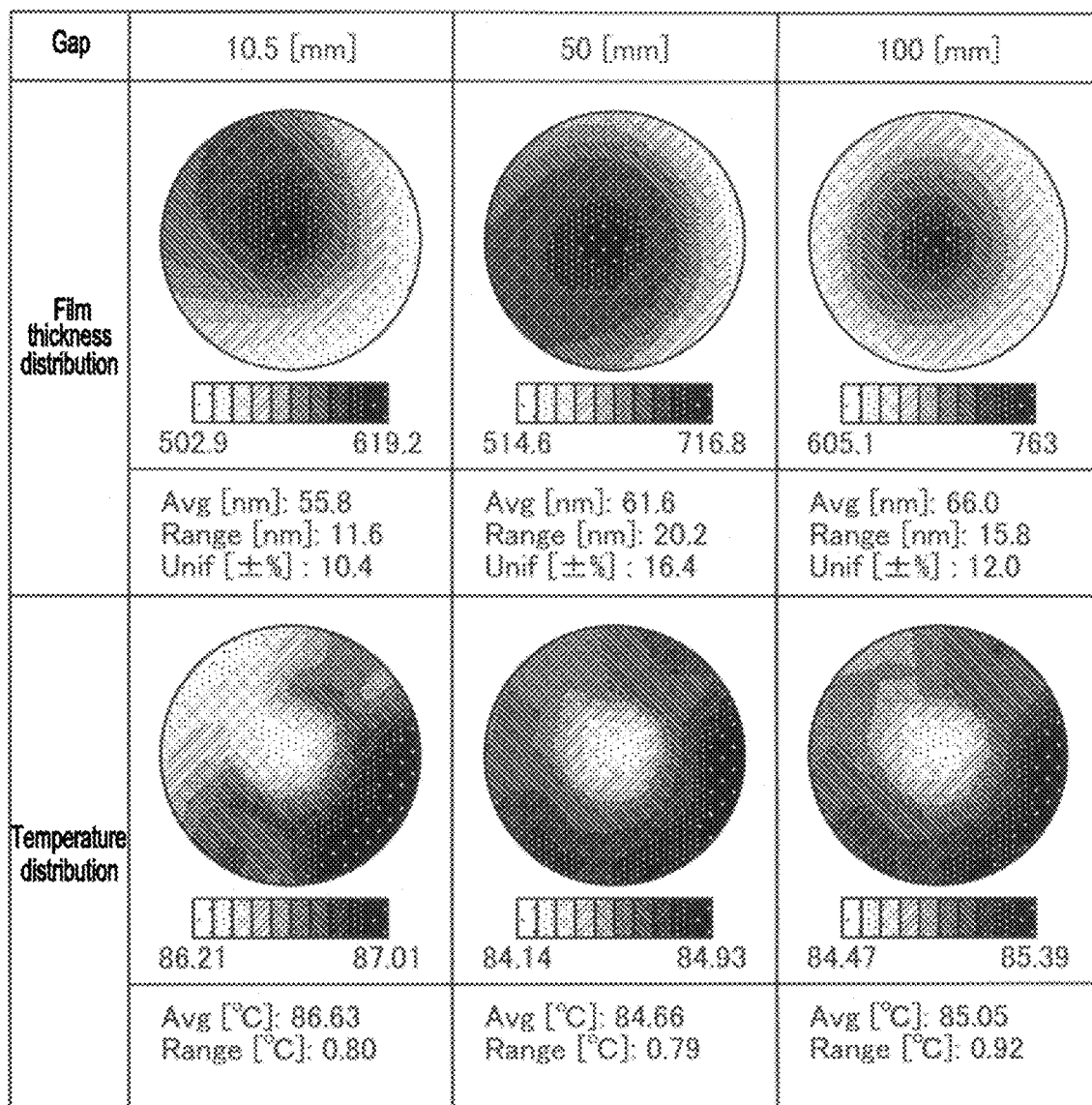
FIG. 7 is a diagram showing exemplary film thickness distributions of organic films formed on wafers and exemplary temperature distributions of the wafers, in a comparative example.

FIG. 7 is a diagram showing exemplary film thickness distributions of organic films formed on wafers W and exemplary temperature distributions of the wafers W, in the comparative example. In the temperature distributions of the wafers W illustrated in FIG. 7, the temperature near the edge of each wafer W is slightly higher than the temperature near the center of the wafer W. In addition, when the gap between the ceiling plate 40 and the wafer W on the stage 21 increases, the radiant heat from the shower head decreases, and thus the temperature near the center of the wafer W falls.

In the film forming apparatus of the comparative example, the mixed gas of the two types of monomers is substantially uniformly supplied to the entire region of each wafer W using the shower head. In addition, in the vicinity of 85° C., for example, as described above with reference to FIG. 3, the higher the temperature, the lower the D/R. Therefore, in the comparative example, regarding the film thickness distribution of the organic film formed on the wafer W, the film thickness in the region where the temperature is relatively low is large and the film thickness in the region where the temperature is relatively high is small. Thus, the film thickness distribution follows the temperature distribution of the wafer W.

In addition, as illustrated in FIG. 7, in the comparative example, at any of the gaps of 10.5 [mm], 50 [mm], and 100 [mm], the uniformity of film thickness Unif of the organic film formed on each wafer W was ±10% or more.

Figure 8:
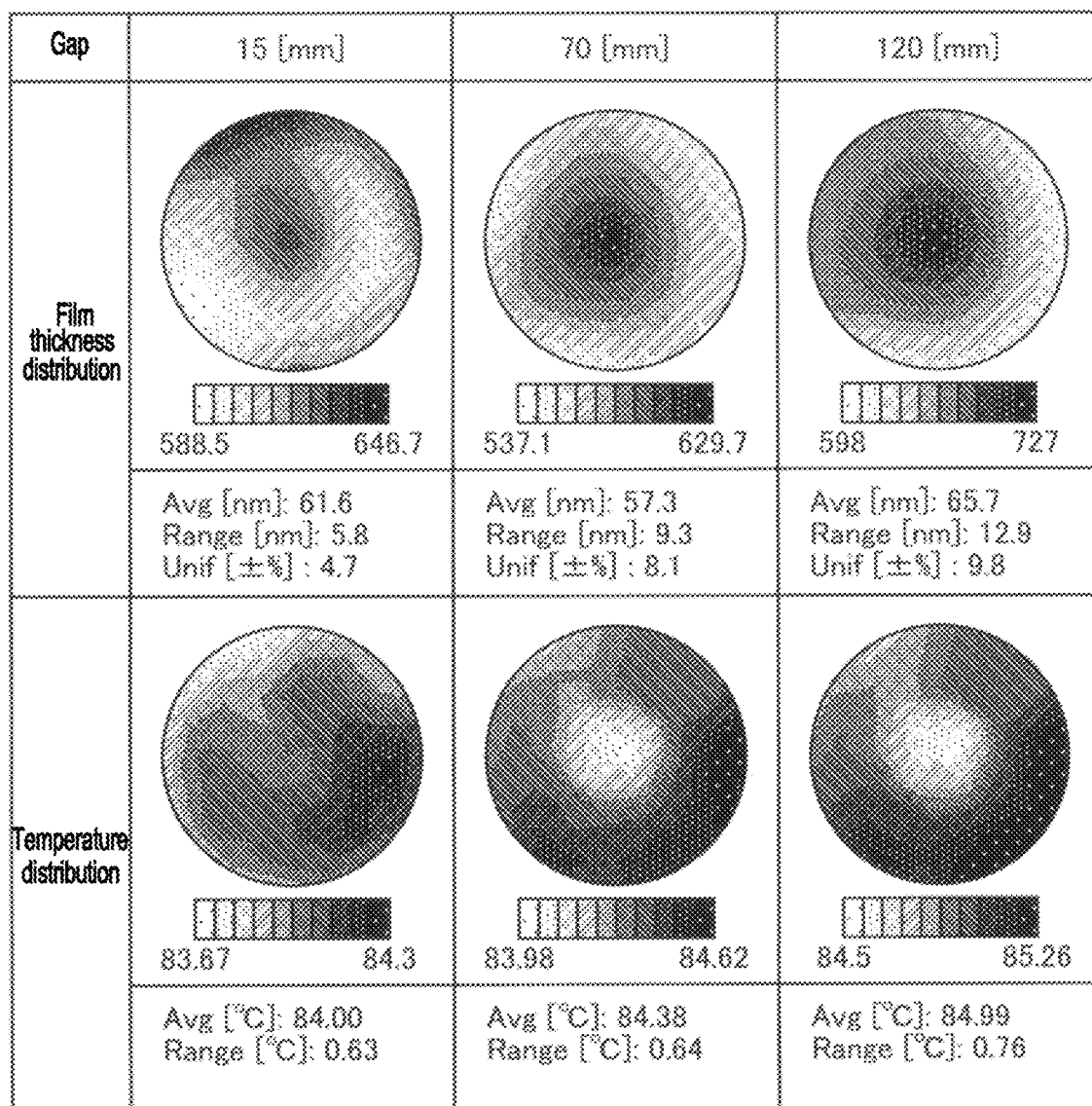
FIG. 8 is a diagram showing exemplary film thickness distributions of organic films formed on wafers and exemplary temperature distributions of the wafers, in the first embodiment.

FIG. 8 is a diagram showing exemplary film thickness distributions of organic films formed on wafers and exemplary temperature distributions of the wafers, in the first embodiment. In the temperature distributions of the wafers W illustrated in FIG. 8, the temperature near the edge of each wafer W is also slightly higher than the temperature near the center of the wafer W. In addition, when the gap between the ceiling plate 40 and the wafer W on the stage 21 increases, the radiant heat from the ceiling plate 40 decreases, and thus the temperature near the center of the wafer W falls.

In the film forming apparatus 1 of the present embodiment, the uniformity of film thickness is improved compared with the comparative example at any of the gaps of 15 [mm], 70 [mm], and 120 [mm].

It is considered that this is because the mixed gas from the ejection ports 41 was not supplied to the inside of the processing space $S_P$, but was supplied to the external space $S_E$ outside the processing space $S_P$, and thus the concentration of the mixed gas became low near the center where the temperature was relatively low and became high near the edge where the temperature was relatively high.

Figure 9:
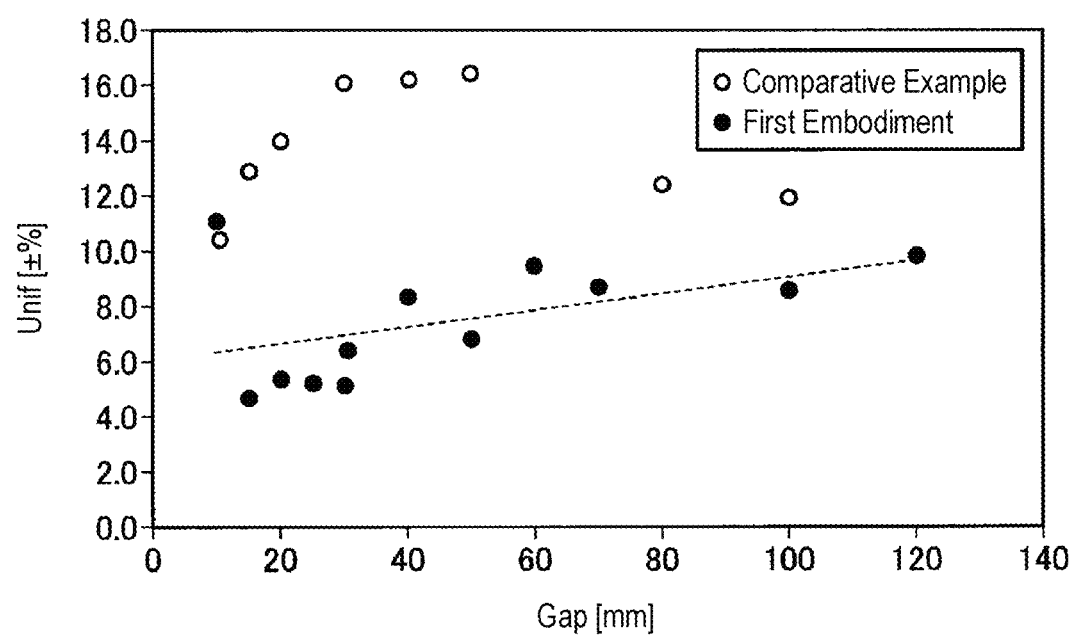
FIG. 9 is a diagram showing an example of a relationship between the gap and the uniformity of a film thickness.

FIG. 9 is a diagram showing an example of a relationship between the gap and the uniformity of a film thickness. As illustrated in FIG. 9, in the film forming apparatus of the comparative example, no correlation is found between the uniformity of film thickness and the gap. In contrast, in the film forming apparatus 1 of the present embodiment, when the gap is in the range of 15 [mm] to 120 [mm], as the gap decreases, the uniformity of film thickness tends to improve.

In the present embodiment, when the gap between the ceiling plate 40 and the wafer W on the stage 21 becomes smaller, the conductance of the processing space $S_P$ becomes smaller, and thus it becomes difficult for the mixed gas supplied into the external space $S_E$ to diffuse into the processing space $S_P$. Therefore, the concentration of the mixed gas in the region near the center of the wafer W becomes lower than the concentration of the mixed gas in the region near the edge of the wafer W. As a result, in the region of the wafer W, the concentration of the mixed gas is high in the region near the edge where the temperature is relatively high, and the concentration of the mixed gas is low in the region near the center where the temperature is relatively low.

As described above, in the film forming apparatus 1 of the present embodiment, the region where the concentration of the mixed gas including the gas containing the first monomer and the gas containing the second monomer is high and the region where the concentration of the mixed gas is low are formed on the wafer W. In addition, the temperature distribution of the wafer W is controlled such that the temperature of a region, which corresponds to the region where the concentration of the mixed gas is high, of the wafer W becomes higher than the temperature of a region, which corresponds to the region where the concentration of the mixed gas is low, of the wafer W. Thereby, in the region on the wafer W, the variation in the thickness of the organic film formed by the mixed gas is suppressed, and thus it is possible to improve the uniformity, compared with the comparative example.

As illustrated in FIG. 9, when the gap is too small, the conductance of the processing space $S_P$ becomes too small, and it becomes more difficult for the mixed gas to diffuse from the external space $S_E$ into the processing space $S_P$, and thus the film thickness near the center of the wafer W becomes extremely small. Therefore, when the gap is too small, the film thickness near the center becomes extremely smaller than that near the edge, and on the contrary, the uniformity of film thickness deteriorates. The amount of the mixed gas diffused from the external space $S_E$ into the processing space $S_P$ can be changed by the pressure in the processing chamber 11 controlled by the pressure adjustment valve 17. Considering the control accuracy of the lifter 63, the gap is preferably in the range of 5 [mm] to 120 [mm], and more preferably in the range of 15 [mm] to 100 [mm].

[Adhesion of Particle]

Here, some of the mixed gas including the gas containing the first monomer and the gas containing the second monomer may form polymer particles in the gas phase before reaching the wafer W. The polymer particles formed in the gas phase become particles and float in the processing chamber 11. When the particles adhere to the wafer W, the film quality of the portion to which the particles adhere is not as intended. Thus, defects occur in the semiconductor devices manufactured from the wafer W, and thus the yield of semiconductor devices decreases. Therefore, it is preferable that the amount of particles adhering to the wafer W be small.

Figure 10:
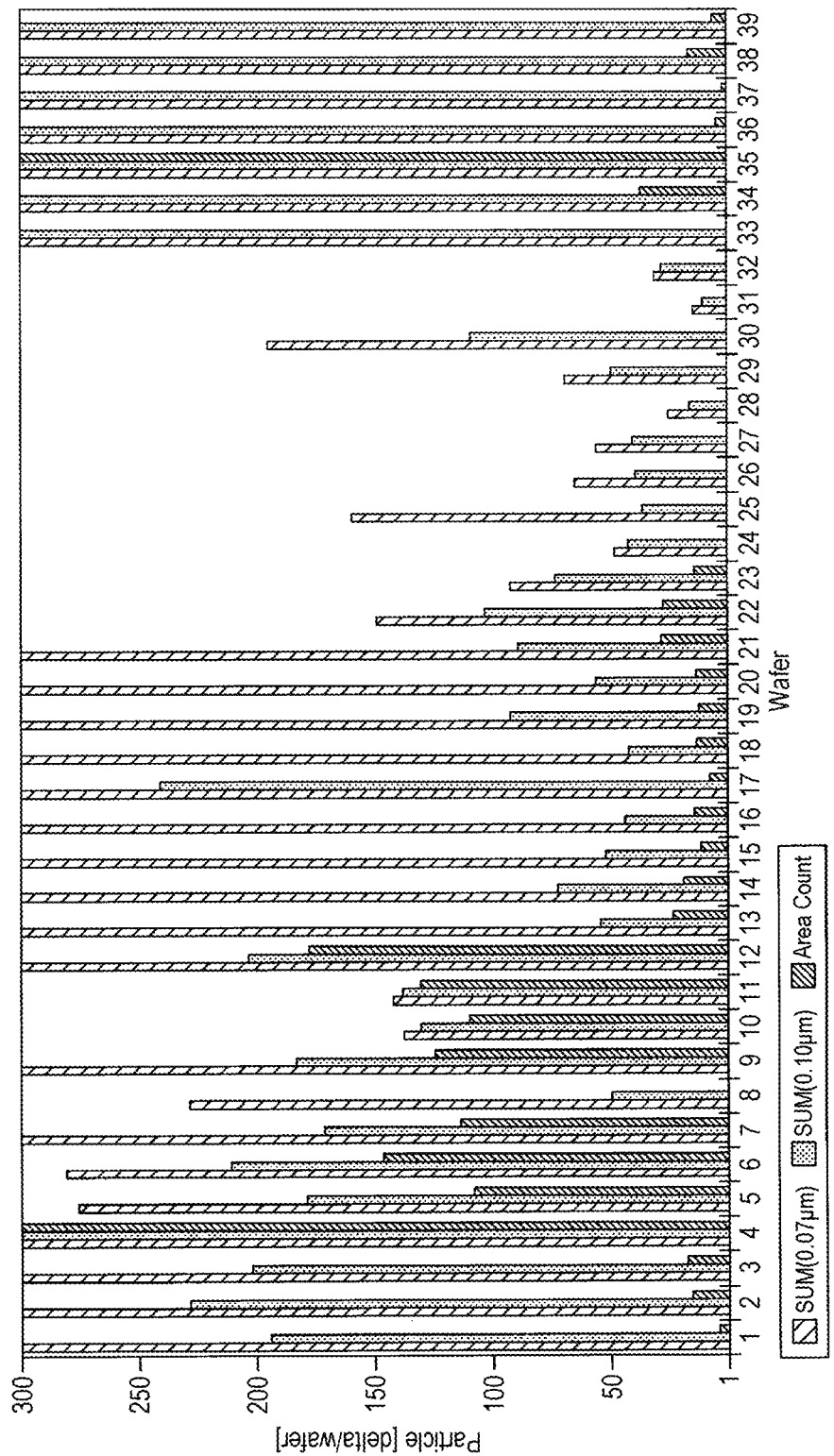
FIG. 10 is a diagram showing an example of an adhesion amount of particles in a comparative example.

FIG. 10 is a diagram showing an example of an adhesion amount of particles in a comparative example. In the film forming apparatus of the comparative example, since the mixed gas is supplied from above the region of the wafer W by the shower head, particles are generated in the processing space $S_P$ above the wafer W. Some of the particles generated in the processing space $S_P$ above the wafer W are exhausted from the exhaust port 130 along a gas flow. However, since most of the particles generated in the processing space $S_P$ are heavier than the gas molecules, the particles drop onto the wafer W due to the influence of gravity and adhere to the wafer W. Therefore, a lot of particles adhere to the wafer W, for example, as shown in FIG. 10.

Figure 11:
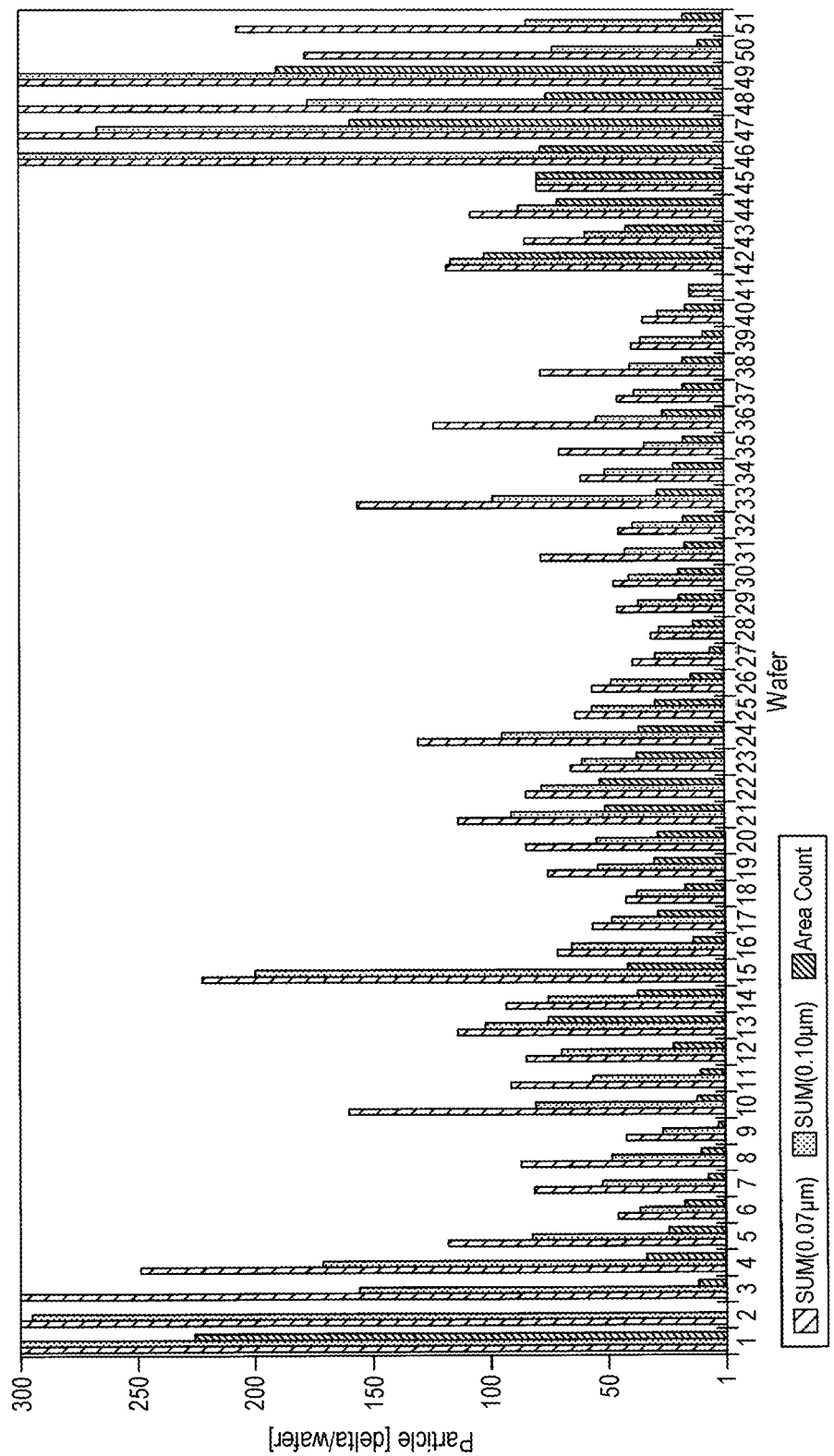
FIG. 11 is a diagram showing an example of an adhesion amount of particles in the first embodiment.

FIG. 11 is a diagram showing an example of an adhesion amount of particles in the first embodiment. In the film forming apparatus 1 of the present embodiment, through the plurality of ejection ports 41, gas is ejected into the external space $S_E$ along the peripheral edge of the wafer W placed on the stage 21. Most of the particles generated in the external space $S_E$ are exhausted from the exhaust port 130 along a gas flow, or fall outside the region of the wafer W due to the influence of gravity. Therefore, particles generated in the external space $S_E$ hardly enter the processing space $S_P$. Meanwhile, since gas molecules are lighter than particles, the gas molecules diffuse in the processing chamber 11, and also enter the processing space $S_P$ to contribute to film formation. Therefore, in the film forming apparatus 1 of the embodiment, as shown in, for example, FIG. 11, adhesion of particles to the wafer W is suppressed compared with the comparative example. As a result, it is possible to improve the yield of semiconductor devices manufactured from the wafer W.

The first embodiment has been described above. The film forming apparatus 1 in the present embodiment is an apparatus for forming an organic film of a polymer on a wafer W by vapor deposition polymerization, and includes a processing chamber 11, a gas supply 300, a concentration distribution controller, and a temperature distribution controller. The processing chamber 11 accommodates a wafer W. The gas supply 300 supplies the gas containing the first monomer and the gas containing the second monomer into the processing chamber 11. The concentration distribution controller controls a gas flow in the processing chamber 11 such that the concentration of the mixed gas including the gas containing the first monomer and the gas containing the second monomer on the wafer W has a predetermined distribution. The temperature distribution controller controls the temperature distribution of the wafer W such that the temperature of the region, which corresponds to the region where the concentration of the mixed gas is high, of the wafer W becomes higher than the temperature of the region, which corresponds to the region where the concentration of the mixed gas is low, of the wafer W. This makes it possible to improve the uniformity of the film thickness of an organic film formed on a wafer W.

In addition, in the above-described embodiment, the concentration distribution controller has a plurality of ejection ports 41, an exhaust port 130, and a lifter 63. The plurality of ejection ports 41 are arranged along the peripheral edge of the wafer W mounted on the stage 21, and the gas containing the first monomer and the gas containing the second monomer are supplied to the region of the wafer W in the processing chamber 11. The lifter 63 controls the distance between the wafer W placed on the stage 21 provided in the processing chamber 11 and the ceiling plate 40 of the processing chamber 11. The concentration distribution controller controls the conductance between the ceiling plate 40 and the wafer W on the stage 21 with respect to the conductance of the space outside the region of the wafer W by the lifter 63, thereby controlling the flow of the mixed gas within the processing chamber 11 such that the concentration of the mixed gas has the predetermined distribution on the wafer W. This makes it possible to improve the uniformity of the film thickness of an organic film formed on a wafer W.

In the above-described embodiment, the temperature distribution controller has a ceiling plate heater 400 and side wall heaters 121a to 121c. The ceiling plate heater 400 is provided on the ceiling plate 40, and the side wall heaters 121a to 121c are provided on the side wall of the processing chamber 11. The temperature distribution controller controls the ratio between the radiant heat from the side walls heated by the side wall heaters 121a to 121c and the radiant heat from the ceiling plate 40 heated by the ceiling plate heater 400, thereby controlling the temperature distribution of the wafer W such that the temperature of the region, which corresponds to the region where the concentration of the mixed gas is high, of the wafer W becomes higher than the temperature of the region, which corresponds to the region where the concentration of the mixed gas is low, of the wafer W. This makes it possible to improve the uniformity of the film thickness of an organic film formed on a wafer W.

Second Embodiment

In the film forming apparatus 1 of the first embodiment, the radiant heat of the wafer W on the stage 21 is applied from the ceiling plate 40 heated by one ceiling plate heater 400. In contrast, in the film forming apparatus 1 of the present embodiment, a heater is individually provided in each of a plurality of regions of the ceiling plate 40, and each of the regions of the ceiling plate 40 is heated to an individual temperature. This makes it possible to control the distribution of the radiant heat radiated from the ceiling plate 40 to the wafer W on the stage 21, and thus to control the temperature distribution of the wafer W more finely. The configuration of the film forming apparatus 1 is the same as that of the film forming apparatus 1 described with reference to FIG. 1 except for the points described below, and thus redundant descriptions will be omitted.

Figure 12:
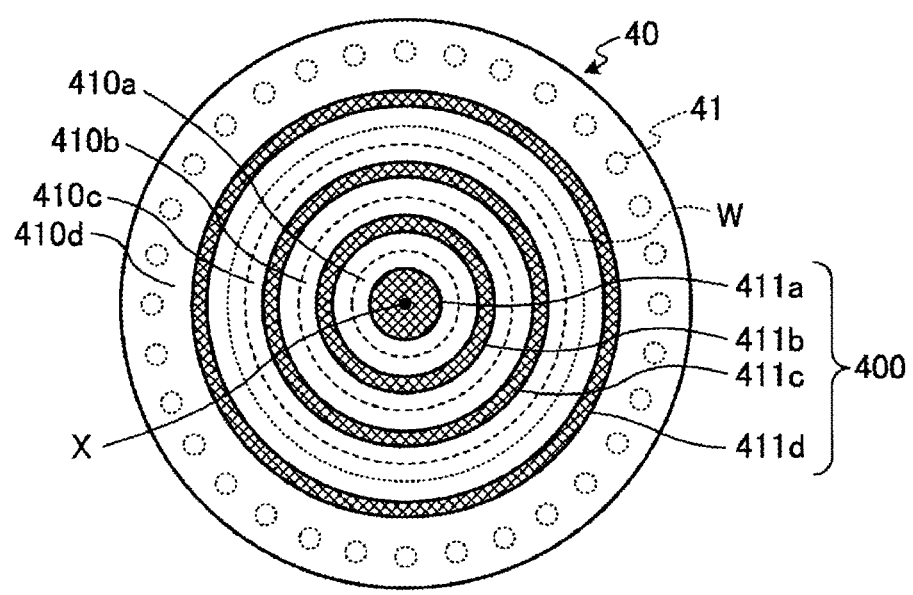
FIG. 12 is a view illustrating an example of a ceiling plate heater in a second embodiment.

FIG. 12 is a view illustrating an example of a ceiling plate heater 400 according to a second embodiment. In FIG. 12, the ceiling plate 40 viewed from the side where the ceiling plate heater 400 is provided is indicated together with the positions of the ejection ports 41 and the position of the wafer W, which are indicated by the dotted lines.

The ceiling plate heater 400 according to the present embodiment has a plurality of partial heaters 411a to 411d that are divided in the radial direction of a circle centered on the central axis of the wafer W placed on the stage 21. In the following, when the partial heaters 411a to 411d are collectively referred to without distinction, they will be referred to as partial heaters 411. The temperatures of respective partial heaters 411 can be controlled independently of each other.

The partial heater 411a is formed in a substantially disk shape, and is arranged in a circular region 410a centered on the central axis X of the wafer W placed on the stage 21. The partial heater 411b is formed in a substantially annular plate shape, and is arranged in a region 410b, which is centered on the central axis X, surrounding the region 410a. The partial heater 411c is formed in a substantially annular plate shape, and is arranged in a region 410c, which is centered on the central axis X, surrounding the region 410b. The partial heater 411d is formed in a substantially annular plate shape, and is arranged in a region 410d, which is centered on the central axis X, surrounding the region 410c. In the present embodiment, the partial heater 411d is arranged outside the region of the wafer W.

As described above, the ceiling plate heater 400 of the present embodiment is divided into a plurality of partial heaters 411 in the radial direction of a circle centered on the central axis X of the wafer W placed on the stage 21. By independently controlling the temperatures of the partial heaters 411, it is possible to control the distribution of the radiant heat applied to the wafer W on the stage 21 from the ceiling plate 40, and thus it is possible to control the temperature distribution of the wafer W more finely.

In the example of FIG. 12, the ceiling plate heater 400 has four partial heaters 411, but the technique disclosed herein is not limited thereto. The ceiling plate heater 400 may include three or less partial heaters 411 or five or more partial heaters 411.

The second embodiment has been described above. In the present embodiment, the wafer W is substantially disk-shaped, and the ceiling plate heater 400 includes a plurality of partial heaters 411 divided in the radial direction of a circle centered on the central axis X of the wafer W placed on the stage 21. By independently controlling the temperature of each of the partial heaters 411, the temperature distribution controller controls the temperature distribution of the wafer W such that the temperature of the region, which corresponds to the region where the concentration of the mixed gas is high, of the wafer W becomes higher than the temperature of the region, which corresponds to the region where the concentration of the mixed gas is low, of the wafer W. This makes it possible to control the temperature distribution of the wafer W more finely.

Third Embodiment

In the film forming apparatus 1 of the first embodiment, a mixed gas of two types of monomers is ejected into the external space $S_E$, and the lifter 63 adjusts the gap between the ceiling plate 40 and a wafer W on the stage 21, thereby controlling the concentration distribution of the mixed gas in the radial direction of the wafer W. In contrast, in the present embodiment, an inert gas is supplied from the ceiling plate 40 to a wafer W along the central axis of the wafer W on the stage 21. This makes it possible to further reduce the concentration of the mixed gas near the center of the wafer W, and thus to control the concentration distribution of the mixed gas in the radial direction of the wafer W more finely.

Figure 13:
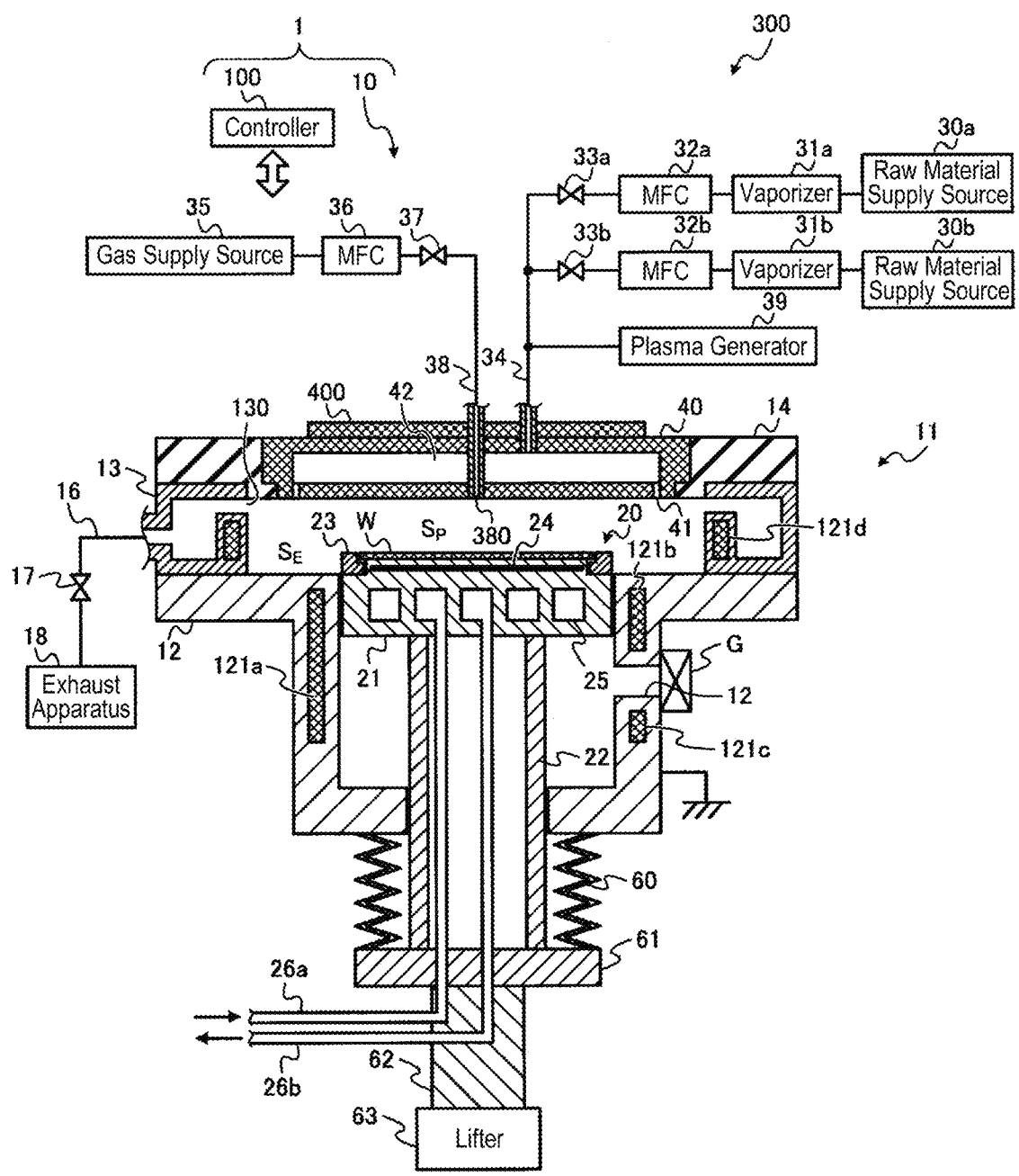
FIG. 13 is a view illustrating an example of a film forming apparatus according to a third embodiment.

FIG. 13 is a view illustrating an example of a film forming apparatus 1 according to a third embodiment of the present disclosure. Except for the points described below, in FIG. 13, the components denoted by the same reference numerals as those in FIG. 1 have the same or similar functions as the components described with reference to FIG. 1, and thus redundant descriptions will be omitted.

In the present embodiment, an ejection port 380 is provided at the position of the ceiling plate 40 on the central axis of the wafer W placed on the stage 21, and a pipe 38 disposed to penetrate the ceiling plate 40 is connected to the ejection port 380. The ejection port 380 is an example of a second supply port. To the pipe 38, a gas supply source 35 is connected via a valve 37 and an MFC 36.

The gas supply source 35 is a supply source of an inert gas such as nitrogen gas. The MFC 36 controls the flow rate of the inert gas supplied from the gas supply source 35. The valve 37 controls supply and stopping of supply of the inert gas to the pipe 38. The inert gas supplied to the pipe 38 is supplied from the ejection port 380 towards the wafer W on the stage 21.

Due to the inert gas ejected from the ejection port 380, the concentration of the mixed gas of the two types of monomers decreases near the center of the wafer W. By controlling the flow rate of the inert gas ejected from the ejection port 380, it is possible to control the concentration distribution of the mixed gas in the radial direction of the wafer W more finely.

In addition, the inert gas ejected from the ejection port 380 to the vicinity of the center of the wafer W radially flows from the processing space $S_P$ to the external space $S_E$. As a result, particles are prevented from entering the processing space $S_P$ from the external space $S_E$. This makes it possible to improve the uniformity of the film thickness of an organic film formed on the wafer W.

The pipe 38 is heated to a temperature of, for example, about 200° C. by a heater (not illustrated). As a result, the temperature of the ceiling plate 40 is prevented from changing due to the inert gas through the pipe 38, and the temperature of the region of the wafer W to which the inert gas is supplied is prevented from changing.

The third embodiment has been described above. In the present embodiment, the ceiling plate 40 is provided with an ejection port 380 on the central axis of the wafer W placed on the stage 21 to supply an inert gas towards the wafer W. This makes it possible to control the concentration distribution of the mixed gas in the radial direction of the wafer W more finely.

Fourth Embodiment

In the film forming apparatus 1 of the first embodiment, the stage heater 24 for heating a wafer W is embedded in the stage 21, and the temperature of the periphery of the wafer W is controlled to be substantially the same as that of the wafer W. In contrast, in the present embodiment, in addition to the stage heater 24, an outer peripheral heater that heats the outer peripheral portion of the stage 21 and the edge ring 23 to a temperature higher than the temperature of the wafer W is embedded in the stage 21. This makes it possible to reduce the amount of an organic film adhering to the outer peripheral portion of the stage 21 and the edge ring 23, and thus to reduce the cleaning frequency of the stage 21 and the edge ring 23.

Figure 14:
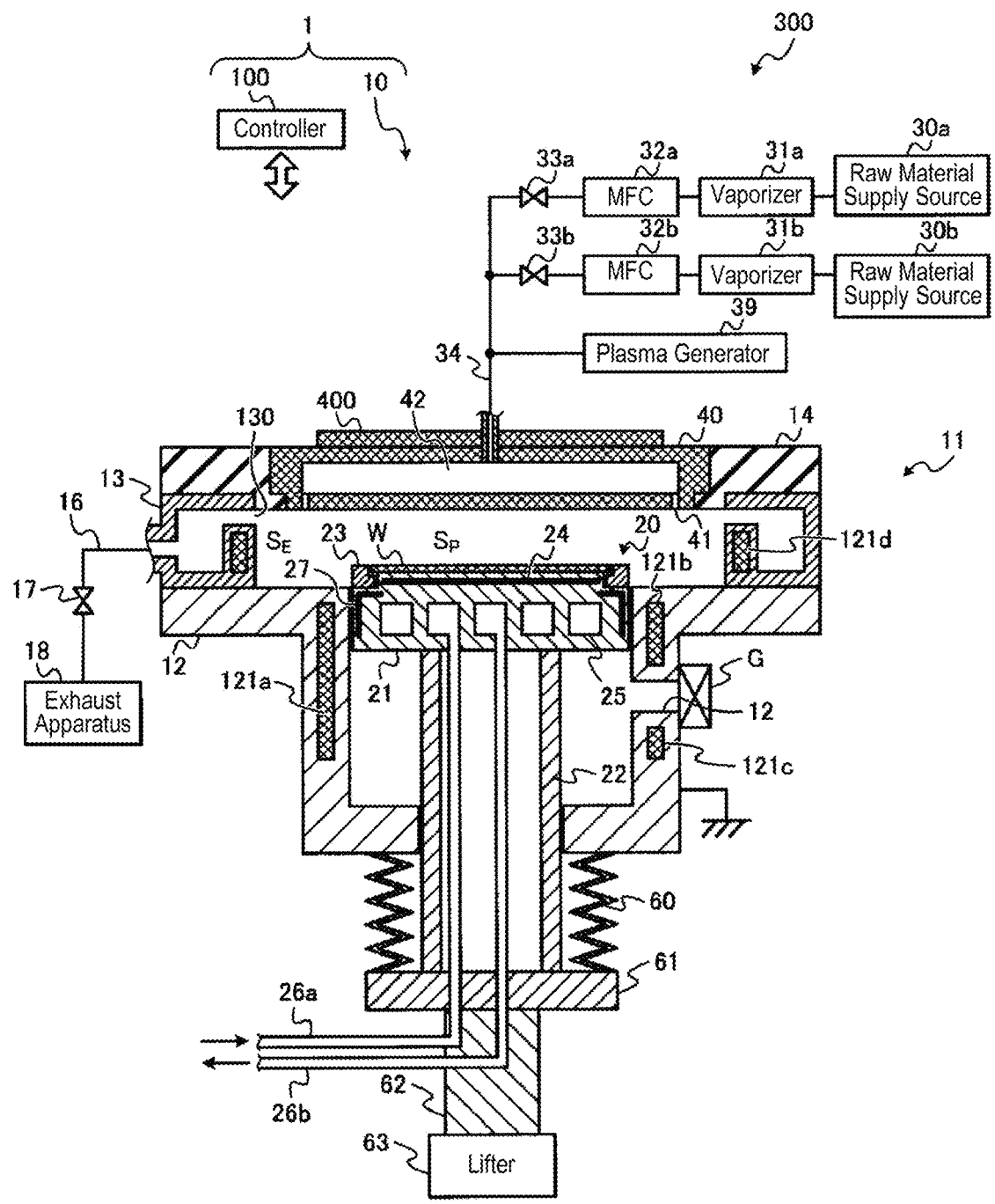
FIG. 14 is a view illustrating an example of a film forming apparatus according to a fourth embodiment.

FIG. 14 is a view illustrating an example of a film forming apparatus 1 according to the fourth embodiment. Except for the points described below, in FIG. 14, the components denoted by the same reference numerals as those in FIG. 1 have the same or similar functions as the components described with reference to FIG. 1, and thus redundant descriptions will be omitted. An outer peripheral heater 27 is embedded in the outer peripheral portion of the stage 21.

Figure 15:
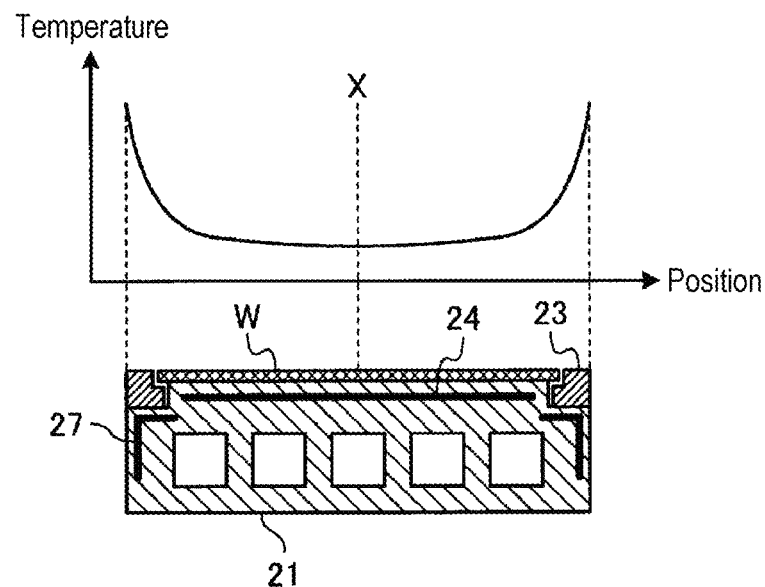
FIG. 15 is a diagram showing an example of a temperature distribution of a stage in the fourth embodiment.

FIG. 15 is a diagram showing an example of a temperature distribution of the stage 21 in the fourth embodiment. For example, as shown in FIG. 15, the outer peripheral portion, which is a region outside the stage 21 on which a wafer W is placed, and the edge ring 23 are heated to a temperature higher than the temperature of the wafer W by the outer peripheral heater 27.

Figure 16:
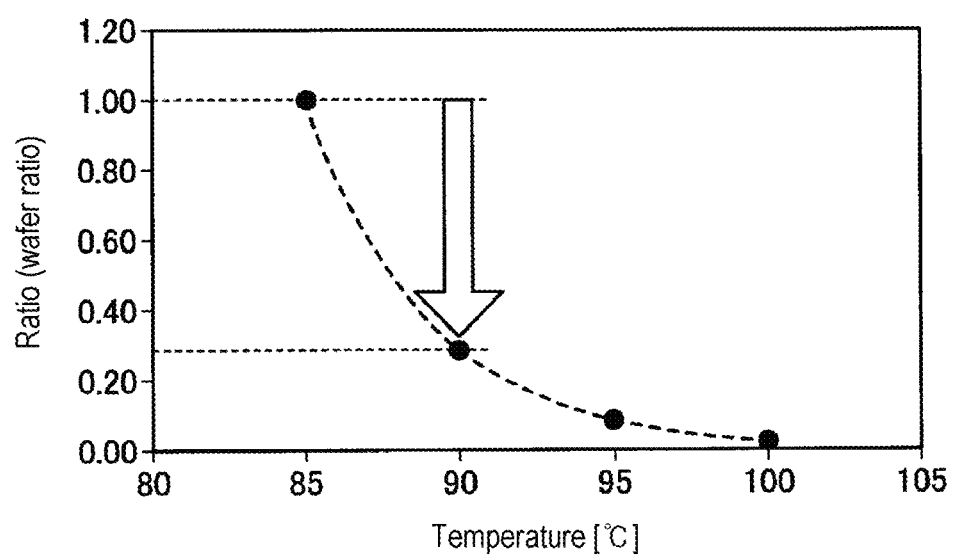
FIG. 16 is a diagram showing an example of a ratio of a film thickness with reference to the film thickness of an organic film formed at 85° C.

FIG. 16 is a diagram showing an example of a ratio of a film thickness with reference to the film thickness of an organic film formed at 85° C. FIG. 16 shows the ratio of the film thickness of an organic film formed on a wafer W at each temperature with reference to the film thickness of the organic film formed on the wafer W, the temperature of which is controlled to 85° C. As illustrated in FIG. 16, when the temperature of a wafer W becomes higher than 85° C., the film thickness of an organic film formed on the wafer W becomes smaller than the film thickness of an organic film formed on a wafer, the temperature of which is controlled to 85° C. For example, as shown in FIG. 16, the film thickness of an organic film formed on the wafer W, the temperature of which is controlled to 90° C. is about 0.3 times the film thickness of an organic film formed on a wafer W, the temperature of which is controlled to 85° C.

Figure 17:
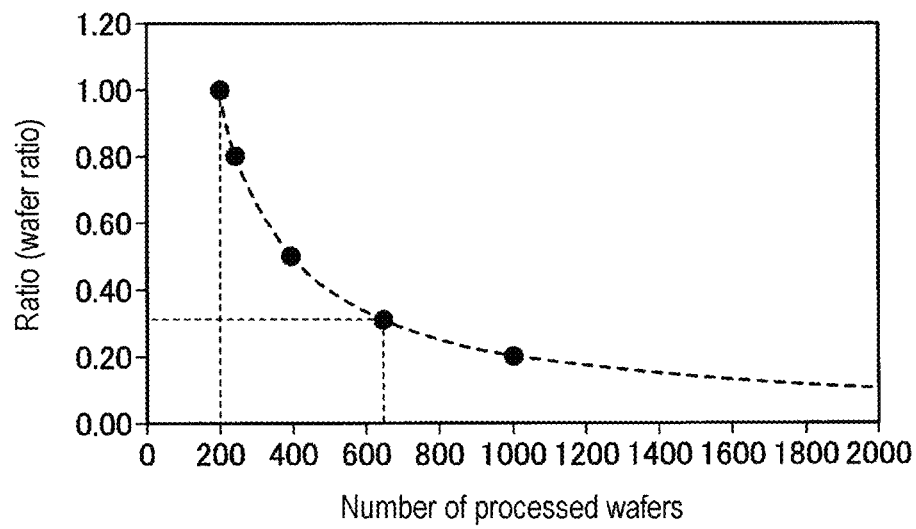
FIG. 17 is a diagram showing an example of a cleaning frequency with respect to the ratio of the film thickness of an organic film.

FIG. 17 is a diagram showing an example of a cleaning frequency with respect to the ratio of the film thickness of an organic film. FIG. 17 shows a relationship between the ratio of the film thickness of an organic film adhering to the outer peripheral portion of the stage 21 and the edge ring 23 with reference to the film thickness of the organic film formed on a wafer W, and the number of processed wafers W that requires cleaning. In FIG. 17, it is assumed that an organic film having a thickness of 50 nm is formed on one wafer W, and that cleaning will be required when the thickness of the organic film adhering to the outer peripheral portion of the stage 21 and the edge ring 23 reaches 100 μm.

When the outer peripheral heater 27 is not provided on the stage 21, the outer peripheral portion of the stage 21 and the edge ring 23 are controlled to have substantially the same temperature as the wafer W. Therefore, the ratio of the film thickness of an organic film adhering to the outer peripheral portion of the stage 21 and the edge ring 23 becomes 1 with reference to the film thickness of the organic film formed on the wafer W. In this case, for example, as shown in FIG. 17, when an organic film is formed on 200 wafers W, the thickness of the organic film adhering to the outer peripheral portion of the stage 21 and the edge ring 23 reaches 100 μm.

Meanwhile, in the film forming apparatus 1 of the present embodiment in which the outer peripheral heater 27 is provided on the stage 21, the outer peripheral portion of the stage 21 and the edge ring 23 are heated to a temperature higher than the temperature of the wafer W. When the outer peripheral portion of the stage 21 and the edge ring 23 are heated to a temperature higher than the temperature of the wafer W by, for example, 5° C., as illustrated in FIG. 16, the film thickness of the organic film adhering to the outer peripheral portion of the stage 21 and the edge ring 23 becomes about 0.3 times the film thickness of the organic film formed on the wafer W. In this case, for example, as shown in FIG. 17, when an organic film is formed on 600 or more wafers W, the thickness of the organic film adhering to the outer peripheral portion of the stage 21 and the edge ring 23 reaches 100 μm.

Thus, when the outer peripheral portion of the stage 21 and the edge ring 23 are heated to a temperature higher than the wafer W by, for example, 5° C., the number of wafers W capable of being processed before cleaning can be tripled. That is, the cleaning frequency can be suppressed to ⅓. This makes it possible to reduce the number of times the process of forming an organic film on a wafer W is stopped by the cleaning, and thus to improve productivity.

By heating the outer peripheral portion of the stage 21 and the edge ring 23 by the outer peripheral heater 27, the temperature near the edge of the wafer W becomes slightly higher than the temperature near the center of the wafer W. However, in that case, the gap between the ceiling plate 40 and the wafer W on the stage 21 is adjusted such that the concentration of the mixed gas near the edge is higher than that near the center of the wafer W. This makes it possible to maintain high the uniformity of the film thickness of an organic film formed on a wafer W.

The fourth embodiment has been described above. In the present embodiment, the film forming apparatus 1 includes an outer peripheral heater 27 provided on the outer peripheral portion of the stage 21 to heat the outside of a region in which the wafer W is placed to a temperature higher than the temperature of the wafer W. This makes it possible to reduce the number of times the film forming processing of an organic film on a wafer W is stopped by the cleaning, and thus to improve productivity.

Fifth Embodiment

In the film forming apparatus 1 of the first embodiment, the first monomer and the second monomer are supplied into the pipe 34, and the first monomer and the second monomer are mixed in the pipe 34. The pipe 34 is heated to a temperature of 100° C. or higher (e.g., 200° C.), but the pressure inside the pipe 34 is higher than that inside the diffusion chamber 42 and inside the processing chamber 11. Since the higher the pressure is, the more easily the polymerization reaction proceeds, a polymer is produced by the mixed gas in the pipe 34, and may be attached to the inner wall of the pipe 34 as deposits.

The deposits attached to the side wall of the pipe 34 may peel off from the side wall and may eventually become particles. Thus, the particles may drift in the processing chamber 11 and may be attached to the wafer W. When the deposits attached to the side wall of the pipe 34 grows without peeling off, the pipe 34 may be blocked by the deposits. Therefore, when a certain amount of deposits is attached to the inside of the pipe 34, the pipe 34 will be replaced. As a result, the processing of forming the organic film on the wafer W is stopped, and thus productivity is reduced.

Therefore, in the present embodiment, the gas containing the first monomer and the gas containing the second monomer are supplied into the diffusion chamber 42 via separate pipes, respectively. This makes it possible to reduce the deposits attached to the inner wall of the pipe, and thus to improve productivity in a film forming process.

Figure 18:
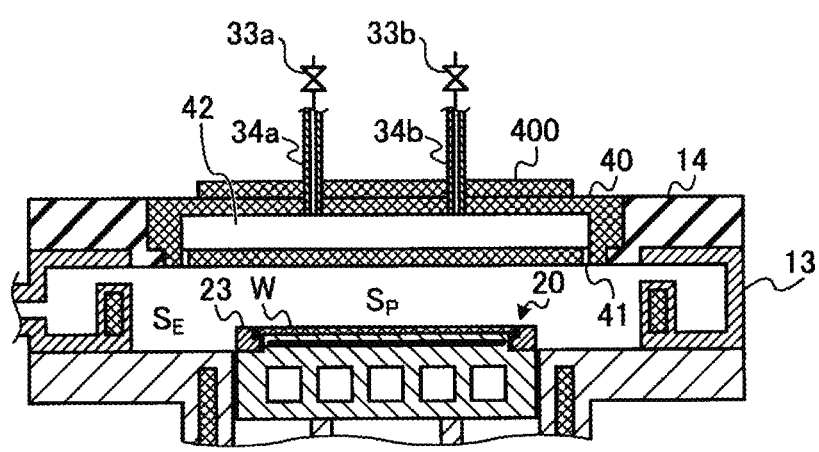
FIG. 18 is a partial cross-sectional view illustrating an example of a film forming apparatus according to a fifth embodiment.

FIG. 18 is a partial cross-sectional view showing an example of a film forming apparatus 1 according to the fifth embodiment. Except for the points described below, in FIG. 18, the components denoted by the same reference numerals as those in FIG. 1 have the same or similar functions as the components described with reference to FIG. 1, and thus redundant descriptions will be omitted.

A pipe 34a and a pipe 34b are connected to the diffusion chamber 42. An MFC 32a, a vaporizer 31a, and a raw material supply source 30a are connected to the pipe 34a via a valve 33a, and the gas containing the first monomer supplied from the raw material supply source 30a flows through the pipe 34a. An MFC 32b, a vaporizer 31b, and a raw material supply source 30b are connected to the pipe 34b via a valve 33b, and the gas containing the second monomer supplied from the raw material supply source 30b flows through the pipe 34b. The gas containing the first monomer supplied through the pipe 34a and the gas containing the second monomer supplied through the pipe 34b are mixed in the diffusion chamber 42, and is then supplied into the processing chamber 11 through ejection ports 41. For example, activated species supplied from the plasma generator 39 are supplied into the diffusion chamber 42 via the pipe 34a, the pipe 34b, or both the pipes 34a and 34b.

With such a configuration, the mixing of the gas containing the first monomer and the gas containing the second monomer is suppressed in the pipe 34a and the pipe 34b. As a result, the attachment of deposits inside the pipes 34a and 34b is suppressed, and the replacement frequency of the pipes 34a and 34b is reduced. Accordingly, it is possible to improve productivity in film forming process.

Sixth Embodiment

In the film forming apparatus 1 of the fifth embodiment, the gas containing the first monomer and the gas containing the second monomer were supplied into the diffusion chamber 42 via separate pipes, respectively, and mixed in the diffusion chamber 42. Although the ceiling plate 40 is heated to a temperature of 100° C. or higher (e.g., 120° C.) by the ceiling plate heater 400, a polymer may be produced by the mixed gas in the diffusion chamber 42.

Figure 19:
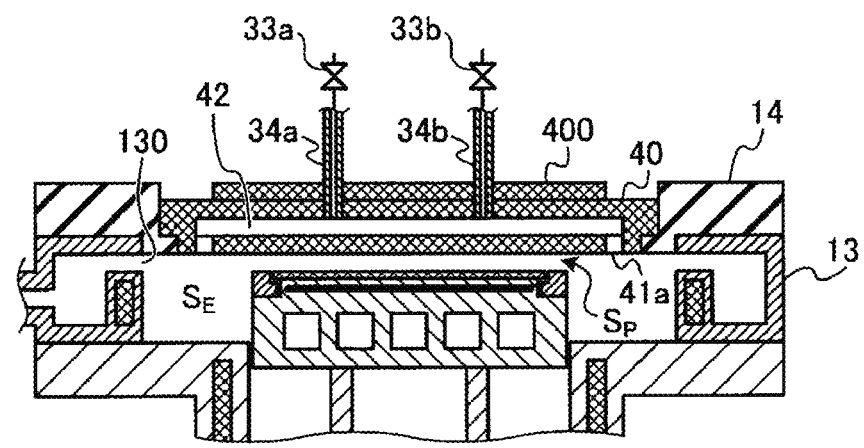
FIG. 19 is a partial cross-sectional view illustrating an example of a film forming apparatus according to a sixth embodiment.

Therefore, in the present embodiment, for example, as illustrated in FIG. 19, the ceiling plate 40 is provided with ejection ports 41a having a larger conductance than the diffusion chamber 42. FIG. 19 is a partial cross-sectional view illustrating an example of a film forming apparatus 1 according to the sixth embodiment. As a result, the gas containing the first monomer and the gas containing the second monomer supplied into the diffusion chamber 42 are ejected into the processing chamber 11 through the ejection ports 41a before being sufficiently mixed in the diffusion chamber 42.

Further, in the present embodiment, as illustrated FIG. 19, for example, the gap between the ceiling plate 40 and the wafer W on the stage 21 is controlled such that the conductance of the processing space $S_P$ becomes smaller than the conductance of the external space $S_E$. As a result, the gas supplied from the ejection ports in the ceiling plate 40 stays in the external space $S_E$. Then, the gas containing the first monomer and the gas containing the second monomer are sufficiently mixed in the process of staying in the external space $S_E$. Thereby, the mixing of the gas containing the first monomer and the gas containing the second monomer in the diffusion chamber 42 is suppressed so that the attachment of deposits to the diffusion chamber 42 can be suppressed.

Seventh Embodiment

In the film forming apparatus 1 of the first embodiment, the ceiling plate heater 400 is disposed on the ceiling plate 40, and the diffusion chamber 42 is provided in the ceiling plate 40. Thus, a gas layer is interposed in the ceiling plate 40. This makes it difficult for the heat of the ceiling plate heater 400 to be transferred to the bottom surface of the ceiling plate 40. Therefore, in the present embodiment, a ring-shaped gas supply pipe is provided around the ceiling plate heater 400 to surround the ceiling plate heater 400, and a gas layer is not disposed between the ceiling plate heater 400 and the ceiling plate. This makes it easy for the heat of the ceiling plate heater 400 to be transferred to the bottom surface of the ceiling plate, and thus to reduce the power consumption of the ceiling plate heater 400.

Figure 20:
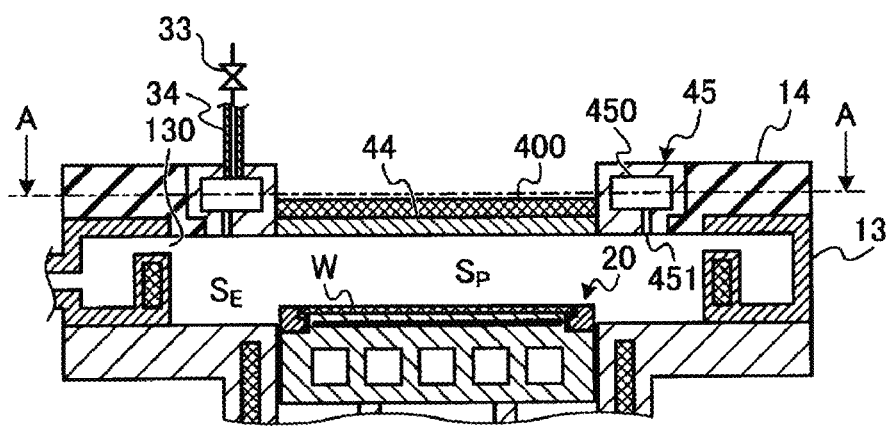
FIG. 20 is a partial cross-sectional view illustrating an example of a film forming apparatus according to a seventh embodiment.
Figure 21:
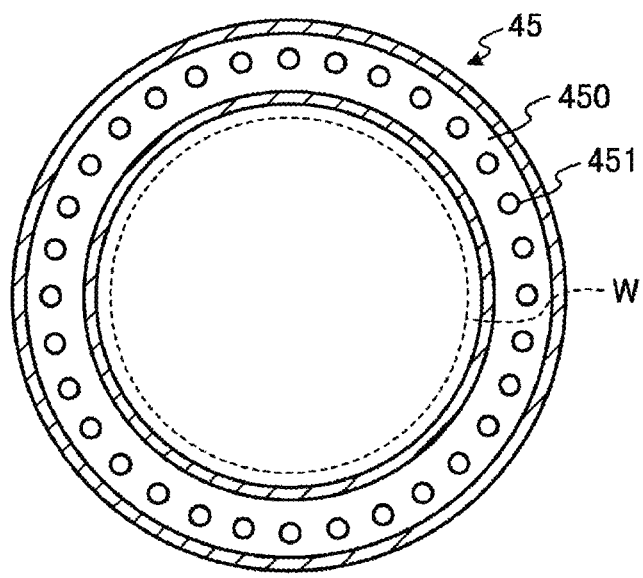
FIG. 21 is a cross-sectional view illustrating an example of a gas supply pipe in the seventh embodiment, taken along line A-A.

FIG. 20 is a partial cross-sectional view illustrating an example of a film forming apparatus 1 according to the seventh embodiment. FIG. 21 is a cross-sectional view illustrating an example of a gas supply pipe 45 in the seventh embodiment, taken along line A-A. Except for the points described below, in FIG. 20, the components denoted by the same reference numerals as those in FIG. 1 have the same or similar functions as the components described with reference to FIG. 1, and thus redundant descriptions will be omitted.

A gas supply pipe 45 is provided above the annular exhaust duct 13. The gas supply pipe 45 is supported by an insulator 14 disposed on the exhaust duct 13. A ceiling plate 44 made of a metal such as aluminum is provided on the inner periphery of the gas supply pipe 45. A ceiling plater heater 400 is disposed on the ceiling plate 44. The insulator 14, the gas supply pipe 45, and the ceiling plate 44 form the ceiling portion of the processing chamber 11.

A diffusion chamber 450 for diffusing gas is formed within the gas supply pipe 45. A pipe 34 communicating with the diffusion chamber 450 is connected to the top surface of the gas supply pipe 45, and a plurality of ejection ports 451 communicating with the diffusion chamber 450 are formed in the bottom surface of the gas supply pipe 45. The gas supplied from the pipe 34 into the diffusion chamber 450 diffuses inside the annular diffusion chamber 450, and is supplied from the ejection ports 451 to the space inside the processing chamber 11. This makes it easy for the heat of the ceiling plate heater 400 to be transferred to the bottom surface of the ceiling plate 44, and thus to reduce the power consumption of the ceiling plate heater 400.

Eighth Embodiment

In the film forming apparatus 1 of the seventh embodiment, since the gas containing the first monomer and the gas containing the second monomer are supplied into the pipe 34, the gas containing the first monomer and the gas containing the second monomer are mixed within the pipe 34, and thus deposits may be attached to the inside of the pipe 34. In contrast, in the present embodiment, the gas containing the first monomer and the gas containing the second monomer are supplied into the diffusion chamber 450 via separate pipes, respectively. This makes it possible to reduce the deposits attached to the inner wall of the pipe, and thus to improve productivity in a film forming process.

Figure 22:
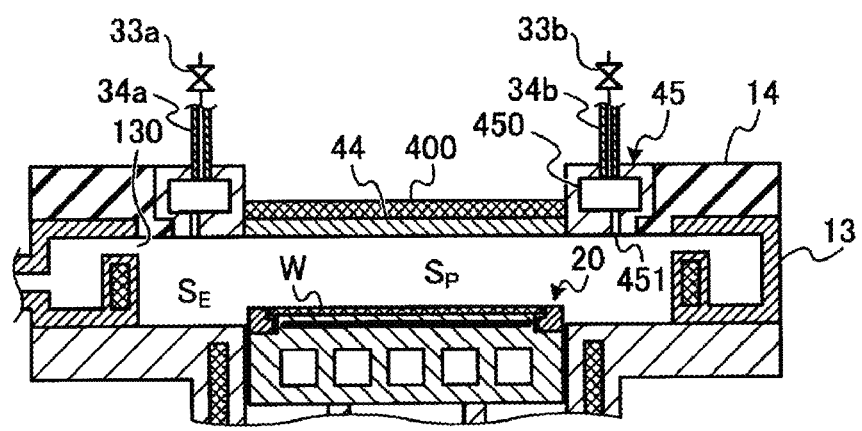
FIG. 22 is a partial cross-sectional view illustrating an example of a film forming apparatus according to an eighth embodiment.

FIG. 22 is a partial cross-sectional view illustrating an example of a film forming apparatus 1 according to the eighth embodiment. Except for the points described below, in FIG. 22, the components denoted by the same reference numerals as those in FIG. 20 have the same or similar functions as the components described with reference to FIG. 20, and thus redundant descriptions will be omitted.

A pipe 34a and a pipe 34b are connected to the diffusion chamber 450 of the gas supply pipe 45. An MFC 32a, a vaporizer 31a, and a raw material supply source 30a are connected to the pipe 34a via a valve 33a, and the gas containing the first monomer supplied from the raw material supply source 30a flows through the pipe 34a. An MFC 32b, a vaporizer 31b, and a raw material supply source 30b are connected to the pipe 34b via a valve 33b, and the gas containing the second monomer supplied from the raw material supply source 30b flows through the pipe 34b. The gas containing the first monomer supplied through the pipe 34a and the gas containing the second monomer supplied through the pipe 34b are mixed in the diffusion chamber 450, and is then supplied into the processing chamber 11 through ejection ports 451. This makes it possible to reduce the deposits attached to the inner walls of the pipes 34a and 34b, and thus to improve productivity in a film forming process.

Ninth Embodiment

In the film forming apparatus 1 of the eighth embodiment, the gas containing the first monomer and the gas containing the second monomer were supplied into the diffusion chamber 450 via separate pipes, respectively, and mixed in the diffusion chamber 450. In contrast, in the present embodiment, the diffusion chamber 450 is partitioned into two spaces, one space is supplied with the gas containing the first monomer, and the other space is supplied with the gas containing the second monomer. Further, the gap between the ceiling plate 40 and the wafer W on the stage 21 is controlled such that the conductance of the processing space $S_P$ becomes smaller than the conductance of the external space $S_E$. As a result, the gas containing the first monomer and the gas containing the second monomer are supplied into the processing chamber 11 from the ejection ports 451 without being mixed in the diffusion chamber 450. Then, the gas containing the first monomer and the gas containing the second monomer are mixed in the process of staying in the external space $S_E$. Thereby, the mixing of the gas containing the first monomer and the gas containing the second monomer in the diffusion chamber 450 is suppressed so that thus the attachment of deposits to the diffusion chamber 450 can be suppressed.

Figure 23:
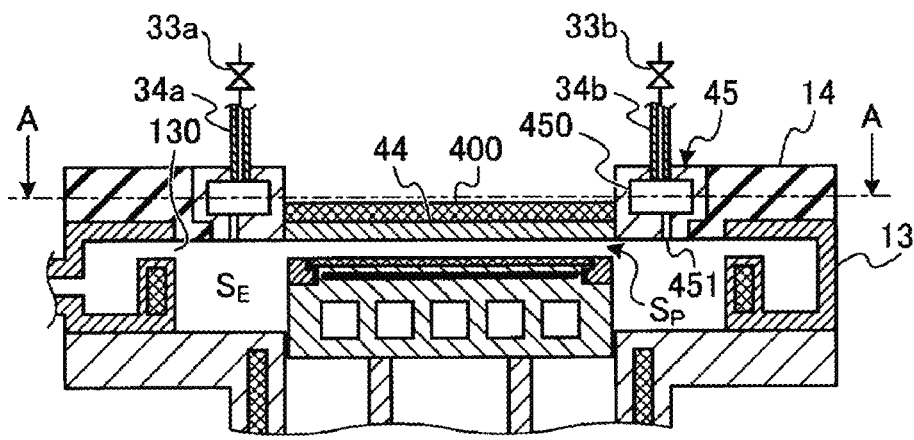
FIG. 23 is a partial cross-sectional view illustrating an example of a film forming apparatus according to a ninth embodiment.
Figure 24:
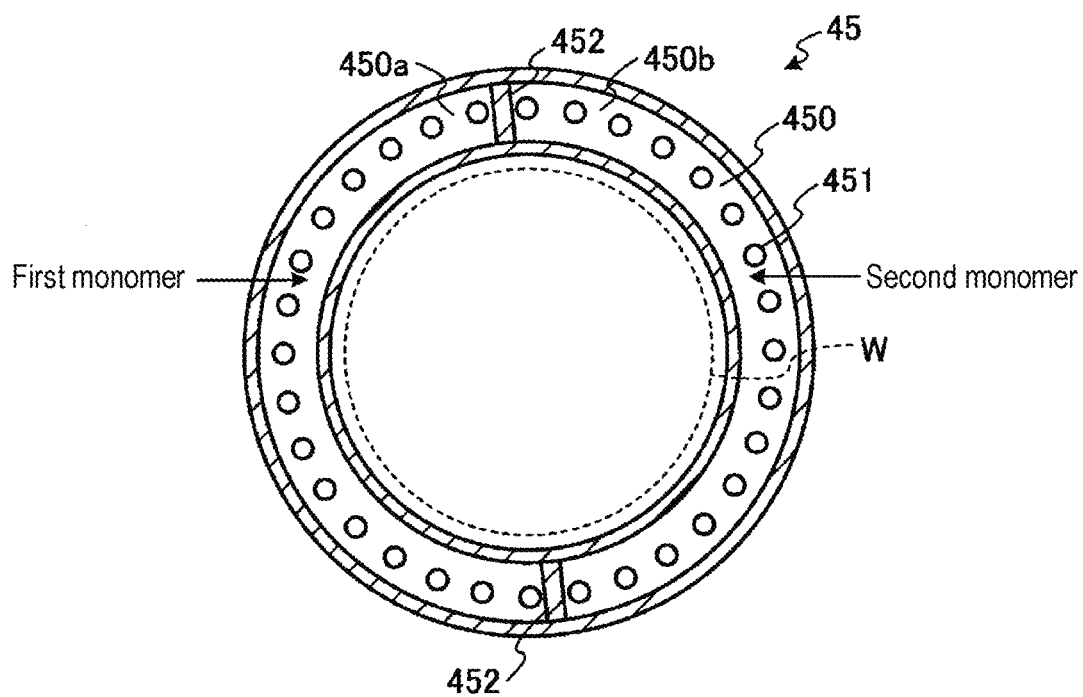
FIG. 24 is a cross-sectional view illustrating an example of a gas supply pipe in the ninth embodiment, taken along line A-A.

FIG. 23 is a partial cross-sectional view illustrating an example of a film forming apparatus 1 according to the ninth embodiment. FIG. 24 is a cross-sectional view illustrating an example of a ring member in the ninth embodiment, taken along line A-A. Except for the points described below, in FIG. 23, the components denoted by the same reference numerals as those in FIG. 22 have the same or similar functions as the components described with reference to FIG. 22, and thus redundant descriptions will be omitted.

For example, as illustrated in FIG. 24, the diffusion chamber 450 is divided into a diffusion chamber 450a and a diffusion chamber 450b by a partition member 452. A pipe 34a is connected to the diffusion chamber 450a, and the gas containing the first monomer is supplied via the pipe 34a. The gas containing the first monomer supplied into the diffusion chamber 450a is supplied into the processing chamber 11 via the ejection ports 451. A pipe 34b is connected to the diffusion chamber 450b, and the gas containing the second monomer is supplied via the pipe 34b. For example, the gas containing the first monomer supplied into the diffusion chamber 450b is supplied into the processing chamber 11 via the ejection ports 451.

Further, as illustrated FIG. 23, for example, the gap between the ceiling plate 40 and the wafer W on the stage 21 is controlled such that the conductance of the processing space $S_P$ becomes smaller than the conductance of the external space $S_E$. As a result, the gases supplied from the ejection ports 451 are sufficiently mixed in the process of staying in the external space $S_E$. Thereby, the mixing of the gas containing the first monomer and the gas containing the second monomer in the diffusion chambers 450a and 450b is suppressed so that the attachment of deposits to the diffusion chambers 450a and 450b can be suppressed.

Tenth Embodiment

In the film forming apparatus 1 of the ninth embodiment, the external space $S_E$ is divided into two spaces along the circumferential direction of the wafer W, one space is supplied with the gas containing the first monomer, and the other space is supplied with the gas containing the second monomers. In contrast, in the present embodiment, the gas supply pipe having the upper and lower two-stage annular diffusion spaces is used, and the gas containing the first monomer and the gas containing the second monomer are supplied to the external space $S_E$ along the circumferential direction of the wafer W. This makes it possible to efficiently mix the gas containing the first monomer and the gas containing the second monomer within the external space $S_E$.

Figure 25:
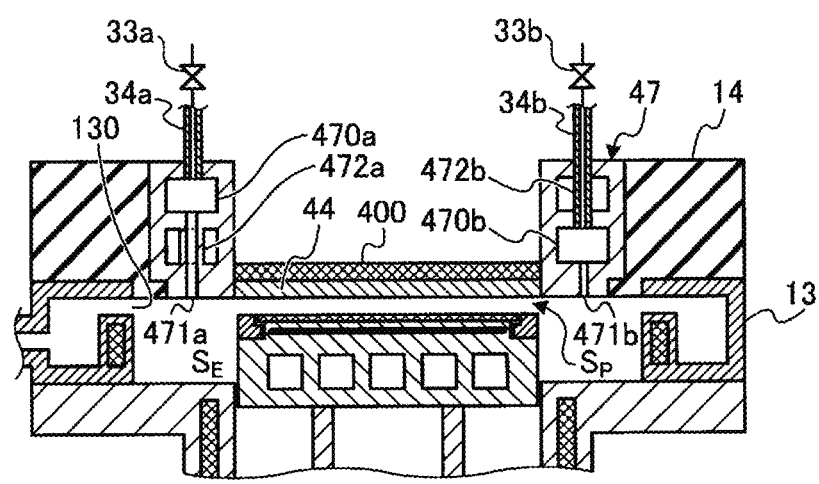
FIG. 25 is a partial cross-sectional view illustrating an example of a film forming apparatus according to a tenth embodiment.
Figure 26:
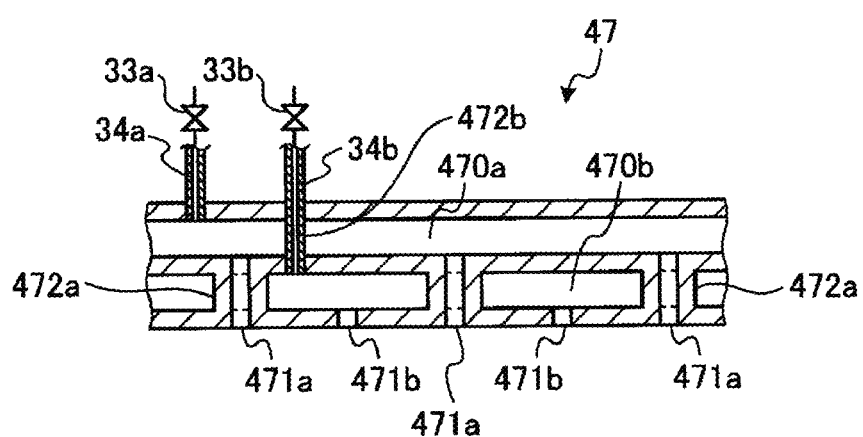
FIG. 26 is a cross-sectional view illustrating an example of a gas supply pipe in the tenth embodiment.

FIG. 25 is a partial cross-sectional view illustrating an example of a film forming apparatus 1 according to the tenth embodiment. FIG. 26 is a vertical cross-sectional view illustrating an example of a gas supply pipe 47 in the tenth embodiment. Except for the points described below, in FIG. 25, the components denoted by the same reference numerals as those in FIG. 23 have the same or similar functions as the components described with reference to FIG. 23, and thus redundant descriptions will be omitted.

A gas supply pipe 47 is provided above the annular exhaust duct 13. The gas supply pipe 47 is supported by an insulator 14 disposed on the exhaust duct 13. A ceiling plate 44 made of a metal such as aluminum is provided on the inner periphery of the gas supply pipe 47. A ceiling plater heater 400 is disposed on the ceiling plate 44. The insulator 14, the gas supply pipe 47, and the ceiling plate 44 form the ceiling portion of the processing chamber 11.

For example, as illustrated in FIGS. 25 and 26, a diffusion chamber 470a and a diffusion chamber 470b for diffusing gases are formed within the gas supply pipe 47. A pipe 34a communicating with the diffusion chamber 470a is connected to the top surface of the gas supply pipe 47. A plurality of ejection ports 471a are formed in the bottom surface of the gas supply pipe 47, and each ejection port 471a communicates with the diffusion chamber 470a via an internal pipe 472a. A pipe 34b communicating with the diffusion chamber 470b is connected to the top surface of the gas supply pipe 47. The pipe 34b communicates with the diffusion chamber 470b via an internal pipe 472b. A plurality of ejection ports 471b are formed in the bottom surface of the gas supply pipe 47, and each ejection port 471b communicates with the diffusion chamber 470b.

With such a configuration, the ejection ports 471a to which the gas containing the first monomer is supplied and the ejection ports 471b to which the gas containing the second monomer is supplied are alternately arranged along the circumferential direction of the wafer W. This makes it possible to efficiently mix the gas containing the first monomer and the gas containing the second monomer within the external space $S_E$.

[Others]

The technology disclosed herein is not limited to the embodiments described above, and various modifications are possible within the scope of the gist the present disclosure.

For example, in each of the above-described embodiments, a polymer having a urea bond is used as an example of the polymer, but a polymer having a bond other than the urea bond may be used as the polymer. The polymer having a bond other than the urea bond may be, for example, polyurethane having a urethane bond. Polyurethane may be synthesized, for example, by copolymerizing a monomer having an alcohol group and a monomer having an isocyanate group.

In addition, in each of the above-described embodiments, the radiant heat from the ceiling plate 40 and the ceiling plate 44 heated by the ceiling plate heater 400 is one of the heat sources for heating a wafer W. However, the technique disclosed herein is not limited thereto. For example, the ceiling plate 40 and the ceiling plate 44 are made of a material such as quartz that transmits light, and, instead of the ceiling plate heater 400, a heating source having a large number of light-emitting elements, such as light-emitting diodes (LEDs), may be disposed on the ceiling plate 40 and the ceiling plate 44. This makes it possible to heat a wafer W using infrared rays emitted from the heating sources via the ceiling plate 40 and the ceiling plate 44.

When light-emitting elements such as light-emitting diodes (LEDs) are used as the heating source, for example, as illustrated in FIG. 12, the light-emitting elements may be arranged concentrically in each of concentric regions 410a to 410d centered on the center axis X of a wafer W placed on the stage 21. Then, the intensity of infrared rays emitted from the light-emitting elements to the wafer W may be independently controlled for each of the light-emitting elements arranged in each of the regions 410a to 410d.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

According to various aspects and embodiments of the present disclosure, it is possible to enhance the uniformity of film thickness of an organic film formed on a substrate.

What is claimed is:

1. A film forming apparatus for forming an organic film of a polymer on a substrate by deposition polymerization, the film forming apparatus comprising:
a processing chamber in which the substrate is accommodated;
a gas supply configured to supply a gas containing a first monomer and a gas containing a second monomer into the processing chamber; and
a concentration distribution controller configured to control a gas flow within the processing chamber such that a concentration of a mixed gas including the gas containing the first monomer and the gas containing the second monomer on the substrate has a predetermined distribution,
wherein the substrate includes a first region and a second region, and the film forming apparatus is configured such that the concentration of the mixed gas in a region corresponding to the first region is higher than the concentration of the mixed gas in a region corresponding to the second region,
wherein the film forming apparatus further comprises a temperature distribution controller configured to control a temperature distribution of the substrate such that a temperature of the first region is higher than a temperature of the second region,
wherein the concentration distribution controller includes:
a plurality of first supply ports arranged along a peripheral edge of the substrate and configured to supply the gas containing the first monomer and the gas containing the second monomer to outside of a region of the substrate within the processing chamber; and
a lifter configured to control a distance between the substrate placed on a stage provided in the processing chamber and a ceiling plate of the processing chamber, and
wherein the concentration distribution controller is configured to control a conductance between the ceiling plate and the substrate on the stage with respect to a conductance of a space outside of the region of the substrate by using the lifter to control a flow of the mixed gas within the processing chamber such that the concentration of the mixed gas on the substrate has the predetermined distribution.

2. The film forming apparatus of claim 1, wherein the temperature distribution controller includes:
a ceiling plate heater provided on the ceiling plate; and
a side wall heater provided on a side wall of the processing chamber,
wherein the temperature distribution controller is configured to control a ratio of radiant heat from the side wall heated by the side wall heater to radiant heat from the ceiling plate heated by the ceiling plate heater to control the temperature distribution of the substrate such that the temperature of the first region is higher than the temperature of the second region.

3. The film forming apparatus of claim 2, wherein the substrate is disk-shaped,
the ceiling plate heater includes a plurality of partial heaters divided in a radial direction of a circle centered on a central axis of the substrate mounted on the stage, and
the temperature distribution controller is configured to independently control a temperature of each of the partial heaters to control the temperature distribution of the substrate such that the temperature of the first region is higher than the temperature of the second region.

4. The film forming apparatus of claim 3, wherein the ceiling plate includes a second supply port provided on the central axis of the substrate placed on the stage, the second supply port being configured to supply an inert gas towards the substrate.

5. The film forming apparatus of claim 4, further comprising:
- an outer peripheral heater provided on an outer peripheral portion of the stage to heat a region outside of a region in which the substrate is placed to a temperature higher than a temperature of the substrate.

6. The film forming apparatus of claim 1, wherein the substrate is disk-shaped, and
- the ceiling plate includes a second supply port provided on a central axis of the substrate placed on the stage, the second supply port being configured to supply an inert gas towards the substrate.

7. The film forming apparatus of claim 1, further comprising:
- an outer peripheral heater provided on an outer peripheral portion of the stage to heat a region outside of a region in which the substrate is placed to a temperature higher than a temperature of the substrate.

* * * * *